US009621332B2

United States Patent
Sengoku

(10) Patent No.: US 9,621,332 B2
(45) Date of Patent: Apr. 11, 2017

(54) CLOCK AND DATA RECOVERY FOR PULSE BASED MULTI-WIRE LINK

(71) Applicant: QUALCOMM Incorporated, San Diego, CA (US)

(72) Inventor: Shoichiro Sengoku, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/084,171

(22) Filed: Mar. 29, 2016

(65) Prior Publication Data

US 2016/0301519 A1    Oct. 13, 2016

Related U.S. Application Data

(60) Provisional application No. 62/146,801, filed on Apr. 13, 2015.

(51) Int. Cl.
| | |
|---|---|
| *H04L 7/027* | (2006.01) |
| *H04L 7/00* | (2006.01) |
| *H04L 25/49* | (2006.01) |
| *H04L 7/033* | (2006.01) |

(52) U.S. Cl.
CPC .......... *H04L 7/0045* (2013.01); *H04L 7/0087* (2013.01); *H04L 25/49* (2013.01); *H04L 7/033* (2013.01)

(58) Field of Classification Search
CPC ..... H04L 7/0045; H04L 7/0087; H04L 25/49; H04L 7/033; H04B 1/10
See application file for complete search history.

(56) References Cited

U.S. PATENT DOCUMENTS

| | | | |
|---|---|---|---|
| 7,308,058 B2 | 12/2007 | Zerbe et al. | |
| 8,516,234 B2 * | 8/2013 | Kobayashi | G09G 5/006 713/1 |
| 8,649,460 B2 | 2/2014 | Ware et al. | |
| 8,823,432 B2 * | 9/2014 | Yang | H03L 7/0802 327/147 |
| 9,118,457 B2 | 8/2015 | Sengoku et al. | |
| 9,424,849 B2 * | 8/2016 | Lesso | H04L 25/4902 |
| 2011/0099410 A1 | 4/2011 | Yin et al. | |
| 2014/0254733 A1 | 9/2014 | Sengoku et al. | |
| 2014/0286466 A1 | 9/2014 | Sengoku et al. | |
| 2015/0023454 A1 | 1/2015 | Lee et al. | |
| 2015/0023458 A1 | 1/2015 | Ngo | |

(Continued)

OTHER PUBLICATIONS

International Search Report and Written Opinion—PCT/US2016/025094—ISA/EPO—Jun. 10, 2016.

*Primary Examiner* — Dac Ha
(74) *Attorney, Agent, or Firm* — Loza & Loza, LLP

(57) ABSTRACT

A method and an apparatus are provided. The apparatus may includes a clock recovery circuit having a plurality of input latches configured to assume a first state when a first pulse is received in one or more of a plurality of input signals, combinational logic configured to provide a second pulse response to the first pulse, a delay circuit configured to produce a third pulse on a receive clock that is delayed with respect to the second pulse, a plurality of output flip-flops configured to capture the first state when triggered by the third pulse. The first state may identify which of the plurality of input signals received input pulses.

10 Claims, 24 Drawing Sheets

(56) References Cited

U.S. PATENT DOCUMENTS

| | | |
|---|---|---|
| 2015/0030112 A1 | 1/2015 | Wiley et al. |
| 2015/0098536 A1 | 4/2015 | Sengoku |
| 2015/0220472 A1 | 8/2015 | Sengoku |

* cited by examiner

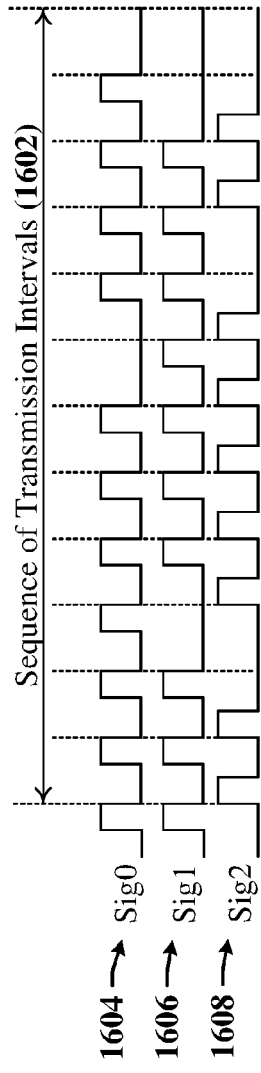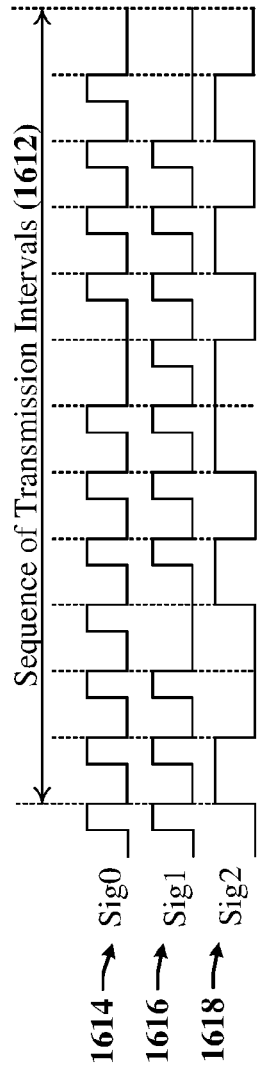
FIG. 16

US 9,621,332 B2

CLOCK AND DATA RECOVERY FOR PULSE BASED MULTI-WIRE LINK

CROSS-REFERENCE TO RELATED APPLICATIONS

This application claims the benefit of U.S. Provisional Application Ser. No. 62/146,801 filed in the U.S. Patent Office on Apr. 13, 2015, the entire content of which being incorporated herein by reference and for all applicable purposes.

TECHNICAL FIELD

The present disclosure relates generally to communication systems, and more particularly, to clock and data recovery from a multi-wire interface that employs pulse-based signaling.

BACKGROUND

Manufacturers of mobile devices, such as cellular telephones, may obtain components of the mobile devices from various sources, including components from different manufacturers. For example, an application processor in a cellular phone may be obtained from a first manufacturer, while the display for the cellular phone may be obtained from a second manufacturer. The application processor and the display or another device may be interconnected using a standards-based or proprietary physical interface. For example, the display may have an interface that conforms to the Display System Interface (DSI) standard specified by the Mobile Industry Processor Interface (MIPI) Alliance.

As the capabilities and functionality of mobile devices continues to grow, there exists an ongoing demand for new techniques to provide flexible and reliable communications in increasingly challenging signaling environments.

SUMMARY

In an aspect of the disclosure, a method, a computer program product, and an apparatus are provided that relate to pulse-based signaling transmitted over a multi-wire interface and clock and data recovery for interfaces that employ pulse-based signaling.

In various aspects, an apparatus includes a clock recovery circuit. The clock recovery circuit may include a plurality of input latches configured to assume a first state when a first pulse is received in one or more of a plurality of input signals, combinational logic configured to provide a second pulse response to the first pulse, a delay circuit configured to produce a third pulse on a receive clock that is delayed with respect to the second pulse, a plurality of output flip-flops configured to capture the first state when triggered by the third pulse. The first state may identify which of the plurality of input signals has received input pulses.

In one aspect, the clock recovery circuit includes a one-shot circuit configured to fix a duration of the second pulse.

In another aspect, the first state is output as a digit of a multi-digit number. The plurality of input signals may be received from a multi-wire interface that includes N wires, and the multi-digit number is expressed as a base ($2^N$−1) number. In one example, the plurality of input signals is received from a two-wire interface and the multi-digit number is expressed as a ternary number. In another example, the plurality of input signals is received from a three-wire interface and the multi-digit number is expressed as a septenary number.

In another aspect, the first state is representative of first information encoded in return-to-zero pulse-encoded signals received from a first portion of the plurality of input signals. The apparatus may include a receiver circuit configured to decode second information from one or more non-return-to-zero signals received from a second portion of the plurality of input signals.

In some examples, the plurality of input signals is received from a capacitively-coupled multi-wire interface or from an inductively-coupled multi-wire interface. In other examples, the plurality of input signals is received from an optical interface.

The clock recovery circuit may include a counter configured to count a number of transitions on one or more wires occurring between consecutive pulses provided on the receive clock.

In various aspects, a method for recovering a clock signal includes generating an edge in a receive clock responsive to detecting a pulse on one or more wires of a multi-wire interface in each of a plurality of transmission intervals, providing a digit of a multi-digit number after the edge in the receive clock is generated in each of the plurality of transmission intervals, combining digits generated in the plurality of transmission intervals to obtain the multi-digit number, and transcoding the multi-digit number to obtain received data. Each bit of the digit may identify whether a pulse was transmitted on one wire of the multi-wire interface during a corresponding transmission interval. A pulse is present on at least one wire of the multi-wire interface during each of the plurality of transmission intervals.

In one aspect, a data word is encoded in the multi-digit number.

In another aspect, the multi-wire interlace includes N wires and the multi-digit number is expressed as a base ($2^N$−1) number. In one example, the multi-wire interface is a two-wire interface and the multi-digit number is expressed as a ternary number, in another example, the multi-wire interface is a three-wire interface where the multi-digit number is expressed as a septenary number.

In one aspect, the method includes decoding first information from return-to-zero pulse-encoded signals received from the multi-wire interface, and decoding second information from one or more non-return-to-zero signals received from the multi-wire interface.

In some examples, capacitively-coupled signals or inductively-coupled signals are received from the multi-wire interface. In other examples, optically-coupled signals are received from the multi-wire interface.

In one aspect, generating the edge in the receive clock includes combining pulses received on the one or more wires into a combination signal, and delaying the combination signal to provide the receive clock. Generating the edge in the receive clock may include combining pulses received on the one or more wires into a combination signal, providing the combination signal to one-shot logic that is configured to produce a fixed-duration pulse responsive to an edge in the combination signal, and delaying the fixed-duration pulse to provide a pulse in the receive clock.

In various aspects, a method includes transcoding a data word into a multi-digit number, and transmitting a combination of pulses over a plurality of connectors for each transmission interval in a sequence of transmission intervals, where each digit, of the multi-digit number defines the combination of pulses for a corresponding transmission interval in the sequence of transmission intervals. Clock information is embedded in the multi-digit number when the data word is transcoded. Clock information may be embedded in the multi-digit number by ensuring that a pulse is transmitted on at least one of the plurality of connectors during each transmission interval in the sequence of transmission intervals.

In some aspects, the plurality of connectors includes N connectors and the multi-digit number is expressed as a base $(2^N-1)$ number. In one example, the plurality of connectors includes two connectors and the multi-digit number is expressed as a ternary number. In another example, the plurality of connectors includes three connectors and the multi-digit number is expressed as a septenary number.

In one aspect, the method includes encoding information in one or more non-return-to-zero signals, and transmitting the one or more non-return-to-zero signals over one or more other connectors of the multi-wire communication link.

In some aspects, combinations of pulses are provided to the plurality of connectors through a capacitive, inductive, or optical coupling.

In various aspects, a communication interface includes a transcoder configured to produce a multi-digit number from a data word, and circuitry configured to provide a combination of pulses for transmission over a plurality of connectors during one transmission interval in a sequence of transmission intervals. The multi-digit, number may include embedded clock information by ensuring that a pulse is transmitted on at least one of the plurality of connectors during each transmission interval in the sequence of transmission intervals. Each combination of pulses may be defined by a digit of the multi-digit number.

In some aspects, the plurality of connectors includes N connectors and the multi-digit number is expressed as a base $(2^N-1)$ number. In one example, the plurality of connectors includes two connectors and the multi-digit, number is expressed as a ternary number. In another example, the plurality of connectors includes three connectors and the multi-digit number is expressed as a septenary number.

In one aspect, the communication interface includes a transmitter circuit configured to encode information in one or more non-return-to-zero signals, and transmit the one or more non-return-to-zero signals over one or more other connectors of the communication interface.

The communication interface may include a transmitter configured to capacitively couple, inductively couple, or optically couple the transmitter to the plurality of connectors.

In various aspects of the disclosure, a processor readable storage medium stores or maintains code that, when executed by one or more processors, causes the one or more processors to perform certain methods disclosed herein. The storage medium may include non-transitory storage media or transitory storage media.

BRIEF DESCRIPTION OF THE DRAWINGS

FIG. 16 illustrates certain configurations of pulse-coded communication interfaces in accordance with certain aspects disclosed herein.

DETAILED DESCRIPTION

Figure 1:
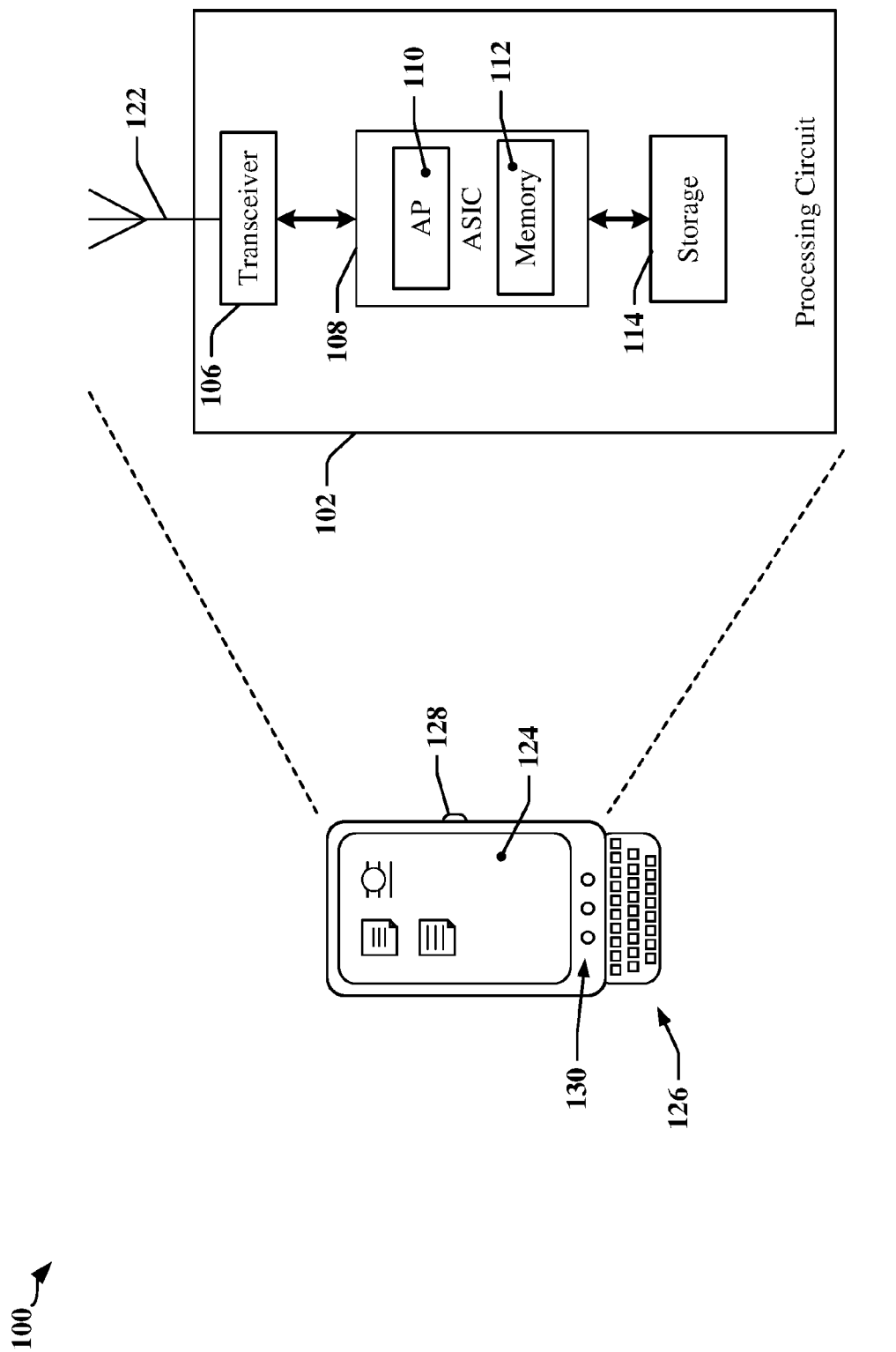
FIG. 1 depicts an apparatus employing a data link between integrated circuit (IC) devices.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of communication systems will now be presented with reference to various apparatus and methods. These apparatus and methods will be described in the following detailed description and illustrated in the accompanying drawings by various blocks, modules, components, circuits, steps, processes, algorithms, etc, (collectively referred to as "elements"). These elements may be implemented using electronic hardware, computer software, or any combination thereof. Whether such elements are implemented as hardware or software depends upon the particular application and design constraints imposed on the overall system.

Overview

Certain aspects disclosed herein relate to communication links provided between devices, and/or between components or subcomponents of various devices, in an apparatus, multiple IC devices, or circuits within an IC device, may communicate rising a bus that includes wires, connectors, traces, optical media, and so on. In some instances, it may be desirable to decouple the IC devices, or circuits within an IC device, and/or to provide capacitive, inductive, or optical connections to the connectors of a bus. In some examples, a communication interface that communicates using pulse-based signaling may be defined. The communication interface may be proprietary, or based on industry standards. Clock, and data recovery circuits, system and methods are disclosed that enable a receiver to reliably generate a receive clock signal that can be used to capture and decode information encoded in pulses transmitted on one or more wires of the bus.

Examples of Communication Links

Certain aspects disclosed herein relate to the operation of a communication interface, and to clock and data recovery from a multi-wire link. The communication interface may be based on standards-defined link or may operate according to proprietary protocols. The communication interface may be adapted to communicate using pulse-based signaling.

In some instances, the communication interface may provide a multi-signal data transfer system that employs or is based on differential signaling including low-voltage differential signaling (LVDS). Data may be encoded in symbols that define or control signaling on the multi-wire link. The data may be encoded using one or more transcoders to perform digital-to-digital data conversion between different encoding types. A transcoder may be adapted to embed clock information in a sequence of encoded symbols by ensuring that a symbol transition occurs at the end of every symbol transmission period. Embedding clock information with data can reduce the number of interconnects associated with a multi-wire communication link with a corresponding reduction in device pin count and/or semiconductor real estate used on an IC device to implement communication interface circuit and input/output (I/O). Embedding clock information with data may obviate the need to send clock information in separate data lanes, where a data lane may correspond to a differential transmission path. Embedding clock information by transcoding is an effective way to minimize skew between clock and data signals, as well as to eliminate the necessity of a phase-locked loop (PLL) to recover the clock information from the data signals.

In one example, the communication interface may operate according to a camera control interface (CCI) protocol defined by MIPI Alliance standards, or a derivative thereof. The CCI protocol uses a two-wire, bi-directional, half duplex, serial interface configured as a bus connecting a master and one or more slaves. Conventional CCI is compatible with a protocol used in a variant of the Inter-Integrated Circuit (I2C) bus and is capable of handling multiple slaves on the bus, with a single master. The CCI bus includes Serial Clock (SCL) and Serial Data (SDA) lines. CCI devices and I2C devices can be deployed on the same bus such that two or more CCI devices may communicate using CCI protocols, while any communication involving an I2C bus uses I2C protocols. Later versions of CCI provide higher throughputs using modified protocols to support faster signaling rates. A CCI extension (CCIe) bus may be used to provide higher data rates for devices that are compatible with CCIe bus operations. Such devices may be referred to as CCIe devices, and the CCIe devices can attain higher data rates when communicating with each other by encoding data as symbols transmitted on both the SCL line and the SDA line of a conventional CCI bus. CCIe devices and I2C devices may coexist on the same CCIe bus, such that in a first time interval, data may be transmitted using CCIe encoding and other data may be transmitted in a different time interval according to I2C signaling conventions.

Examples of Devices Employing Communication Links

FIG. 1 depicts an apparatus 100 that may employ a communication link between IC devices. In one example, the apparatus 100 may include a communication device that communicates through a radio frequency (RF) communications transceiver 106 with a radio access network (RAN), a core access network, the Internet and/or another network. The communications transceiver 106 may be operably coupled to a processing circuit 102. The processing circuit 102 may be implemented using a system-on-chip (SoC) IC, one or more application-specific integrated circuit (ASIC) 108, and/or other IC devices. The ASIC 108 may include logic circuits, memory 112 and one or more processing devices, such as an application processor 110. The processing circuit 102 may include and/or be coupled to processor-readable storage 114. The processor-readable storage 114 may include non-transitory storage media and may be used to store and maintain data and instructions for execution by the application processor 110 or another controller or processor in the processing circuit 102. The processing circuit 102, may be controlled by one or more of an operating system, or other control program that may provide an application programming interface (API) layer that supports and enables execution of software modules provided or residing in the processor-readable storage 114, and/or the memory 112. The processor-readable storage 114 and/or the memory 112 may include read-only memory (ROM) or random-access memory (RAM), electrically erasable programmable read-only memory (EEPROM), flash cards, or any memory device that can be used in processing systems and computing platforms, in some examples, the processor-readable storage 114 and/or the memory 112 include registers used to maintain parameters that configure certain operational modes or functions of the processing circuit 102. The processing circuit 102, may access a local database, which may be implemented using the processor-readable storage 114 and/or the memory 112 to maintain operational parameters and other information used to configure and operate the apparatus 100. The local database may be implemented using a database module. The processing circuit may be operably coupled to external devices such as an antenna 122, a display 124, operator controls, such as a button 128 and a keypad 126 among other components.

Figure 2:
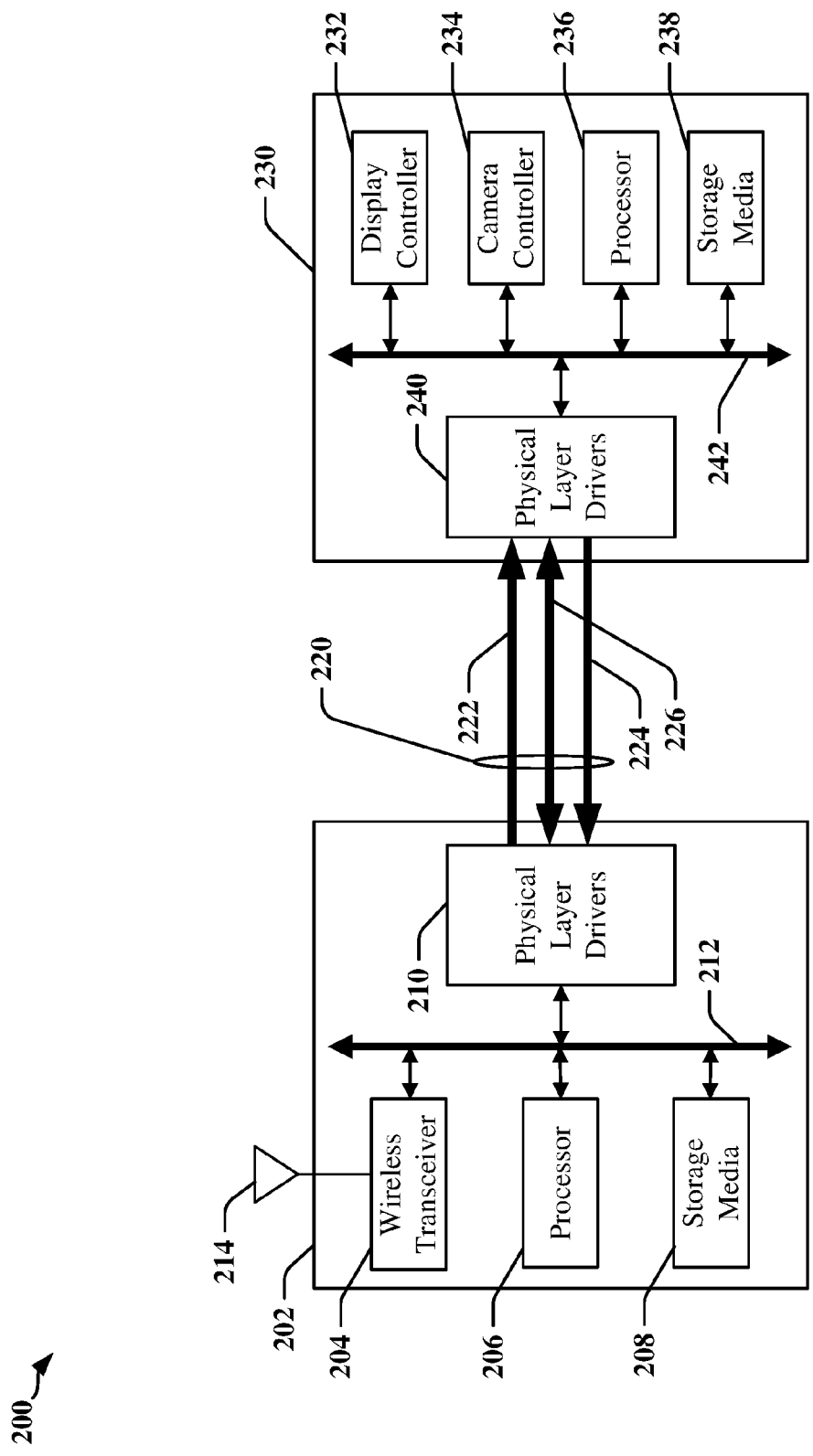
FIG. 2 illustrates a system architecture for an apparatus employing a data link between IC devices.

FIG. 2 illustrates an example of an architecture for an apparatus 200 such as a mobile communication device that employs a communication link 220 to connect various subcomponents. In the illustrated example, the apparatus 200 includes a plurality of devices that may be located in close proximity to one another, or may be physically located in different parts of the apparatus 200. The communication link 220 may be used to connect various IC devices where, for example, two IC devices 202 and 230 may exchange data and control information through the communication link 220. In one example, the communication link 220 may be provided on a chip carrier, substrate or circuit board that carries the IC devices 202 and 230. In another example, a portion of the communication link 220 may include a cable or optical connection, in some instances, the cable or optical connection may interconnect a first IC device 202 or 230 located in a keypad section of a mobile computing device and a second IC device 230 or 202 located in a display section of the mobile computing device.

The communication link 220 may provide multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communication channel 222 may be referred to as a forward link while a second communication channel 224 may be referred to as a reverse link. The first IC device 202 may be designated as a host system or transmitter, while the second IC device 230 may be designated as a client, system or receiver, even if both IC devices 202 and 230 are configured to transmit and receive on the communication link 220. In one example, the first communication channel 222 may operate at a higher data rate when communicating data from a first IC device 202 to a second IC device 230, while the second communication channel 224 may operate at a lower data rate when communicating data from the second IC device 230 to the first IC device 202.

The IC devices 202 and 230 may each have a controller, sequencer, or other computing device or processor 206, 236. In one example, the first IC device 202 may perform core functions of the apparatus 200, including communicating through a transceiver 204 and an antenna 214, while the second IC device 230 may support a user interface that manages or operates a display controller 232. In this example, the second IC device 230 may be adapted to control operations of a camera or video input device using a camera controller 234. Other features supported by one or more of the IC devices 202 and 230 may relate to a keyboard, a voice-recognition component, and other input or output devices. The display controller 232 may include circuits and software drivers that support displays such as a liquid crystal display (LCD) panel, touch-screen display, indicators, and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The second communication channel 224 may be configured as a reverse link that may be operated in the same manner as the first communication channel 222 when the first communication channel 222 is configured as a forward link. The first communication channel 222 and the second communication channel 224 may be capable of transmitting at comparable speeds or at different speeds, where speed may be expressed as data transfer rate and/or clocking rates. Data rates on a forward link may be substantially the same as data rates on the reverse link or the data rates in opposite directions may differ by orders of magnitude, depending on the application. In some applications, a single communication channel 226 may be configured as a bidirectional link that supports communications between the first IC device 202 and the second IC device 230. The first communication channel 222 and/or second communication channel 224 may be configurable to operate in a bidirectional mode and, for example, the forward and reverse communication channels 222 and 224 may share the same physical connections and operate in a half-duplex manner. In one example, the communication link 220 may be operated to communicate control, command and other information between the first IC device 202 and the second IC device 230 in accordance with an industry or other standard.

In some instances, the forward and reverse communication channels 222 and 224 may be configured or adapted to support a wide video graphics array (WVGA) 80 frames per second LCD driver IC without a frame buffer, delivering pixel data at 810 Mbps for display refresh. In another example, the forward and reverse communication channels 222 and 224 may be configured or adapted to enable communications between with dynamic random access memory (DRAM), such as double data rate synchronous dynamic random access memory (SDRAM). Encoding devices 210 and/or 240 may be configured to encode multiple bits per clock transition, and multiple sets of wires can be used to transmit and receive data from the SDRAM, control signals, address signals, and other signals.

The forward and reverse communication channels 222 and 224 may comply with, or be compatible with application-specific industry standards. In one example, certain MIPI Alliance standards define physical layer interfaces between an application processor IC device 202 and an IC device 230 that supports the camera or display in a mobile device. The MIPI Alliance standards may define specifications that govern the operational characteristics of products that comply with standards or specifications defined by the MIPI Alliance for mobile devices. In some instances, the MIPI Alliance standards or specifications may be implemented in interfaces that employ complimentary metal-oxide-semiconductor (CMOS) parallel busses.

The communication link 220 of FIG. 2 may be implemented as a wired bus that includes a plurality of signal wires (denoted as N wires). The N wires may be configured to carry data encoded in symbols, where clock information is embedded in a sequence of the symbols transmitted over the plurality of wires. Encoding schemes that embed timing information by ensuring transitions between consecutive symbols may be referred to as transition encoding schemes. Transition encoding schemes may be used, for example, in N-factorial (N!) interfaces, and CCIe interfaces.

N! Interfaces

Figure 3:
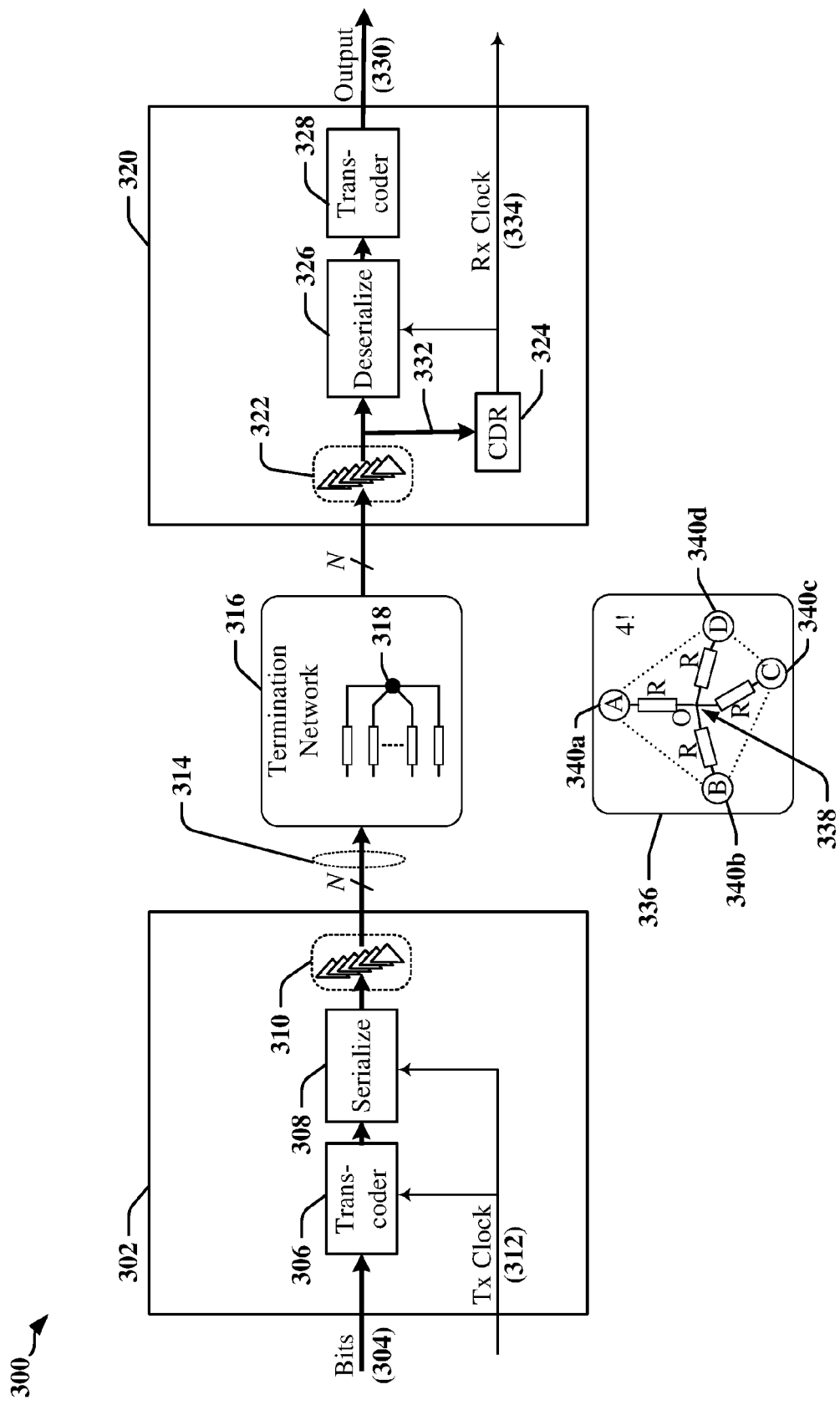
FIG. 3 illustrates an example of an N! multi-wire interface.

FIG. 3 is a diagram illustrating an example of an N! interface 300 that includes an N-wire communication link 314 provided between two devices 302 and 320. At a transmitter 302, a transcoder 306 may be used to encode data bits 304 and clock information in symbols to be transmitted over a set of N wires of the communication link 314. In the transmitter 302, clock information may be derived from a transmit clock 312 and may be encoded in a sequence of symbols transmitted in $_NC_2$ differential signals over the N wires of the communication link 314 by ensuring that a signaling state transition occurs on at least one of the $_NC_2$ signals between consecutive symbols. When N! encoding is used to drive the N wires of the communication link 314, each bit of a symbol is transmitted as a differential signal by one of a set of differential line drivers 310, where the differential line drivers 310 are coupled to different, pairs of the N wires of the communication link 314. Each wire of the N wires of the communication link 314 may be paired with each of the other N−1 wires in the N wires of the communication link 314, and the number of available combinations of wire pairs ($_NC_2$) determines the number of signals that can be transmitted over the N wires of the communication link 314. The number of data bits 304 that can be encoded in a symbol may be calculated based on the number of available signaling states available for each symbol transmission interval.

A termination impedance (typically resistive) couples each of the N wires of the communication link 314 to a common center point 318 in a termination network 316. It will be appreciated that the signaling state of the N wires of the communication link 314 reflects a combination of the currents in the termination network 316 attributed to the differential line drivers 310 coupled to each wire. It will be further appreciated that the center point 318 is a null point, whereby the currents in the termination network 316 cancel each other at the center point 318. In one example, each of the 4 wires in a 4! interface is connected to a terminal 340a, 340b, 340c, 340d of a termination network 336. Each terminal 340a, 340b, 340c, 340d is coupled by a termination resistor to a center point 338 of the termination network 336.

An N! encoding scheme need not use a separate clock channel and/or non-return-to-zero decoding because at least one of the $_NC_2$ signals in the link transitions between consecutive symbols. Effectively, the transcoder 306 ensures that a transition occurs between each pair of consecutive symbols transmitted on the N wires of the communication link 314 by producing a sequence of symbols in which signaling states of the N wires change between consecutively transmitted symbols. In the example depicted in FIG. 3, four wires are provided (N=4), and the 4 wires can carry $_4C_2=6$ differential signals. The transcoder 306 may employ a mapping scheme to generate raw symbols for transmission on the N wires. The transcoder 306 may map data bits 304 to a set of transition numbers. The transition numbers may be used to select raw symbols for transmission based on the value of the immediately preceding symbol such that the selected raw symbol is different from the preceding raw symbol. The raw symbols may be serialized by the serializers 308 to obtain a sequence of symbols for transmission over the N-wires of the communication link 314. In one example, a transition number may be used to lookup a data value corresponding to the second of the consecutive raw symbols with reference to the first of the consecutive raw symbols. At the receiver 320, a transcoder 328 may employ a mapping to determine a transition number that characterizes a difference between a pair of consecutive raw symbols, using a lookup table for example. The transcoders 306, 328 operate on the basis that every consecutive pair of raw symbols includes two different symbols.

The transcoder 306 at the transmitter 302 may select between N!−1 available signaling states at every symbol transition, in one example, a 4! system provides 4!−1=23 signaling states for the next symbol to be transmitted at each symbol transition. The hit rate may be calculated as $\log_2$ (available_states) per transmit clock cycle.

According to certain aspects disclosed herein, double data rate (DDR) signaling may be employed to increase the interface bandwidth by transmitting two symbols in each period of the transmit clock 312. Symbol transitions occur at both the rising edge and falling edge of the transmit clock in a system using DDR clocking. The total available states in the transmit clock cycle is $(4!-1)^2=(23)^2=529$ and the number of data bits 304 that can be transmitted per symbol may be calculated as $\log_2 (529)=9.047$ bits.

A receiving device 320 receives the sequence of symbols using a set of line receivers 322 where each receiver in the set of line receivers 322 determines differences in signaling states on one pair of the N wires of the communication link 314. Accordingly, $_NC_2$ receivers 322 are used, where N represents the number of wires. The $_NC_2$ receivers 322 produce a corresponding number of raw symbols as outputs. In the 4-wire example, the signals received on the 4 wires are processed by 6 receivers ($_4C_2=6$) to produce a raw symbol signal 332 that is provided to a clock and data recovery (CDR) circuit 324 and deserializers 326. The raw symbol signal 332 is representative of the signaling state of the N wires of the communication link 314, and the CDR circuit 324 may process the raw symbol signal 332 to generate a receive clock signal 334 that can be used by the deserializer 326.

The receive clock signal 334 may be a DDR clock signal that can be used by external circuitry to process output data 330 provided by the transcoder 328. The transcoder 328 decodes a block of received symbols from the deserializer 326 by comparing each symbol to its immediate predecessor. The transcoder 328 produces output data 330 corresponding to the data bits 304 provided to the transmitter 302.

Figure 4:
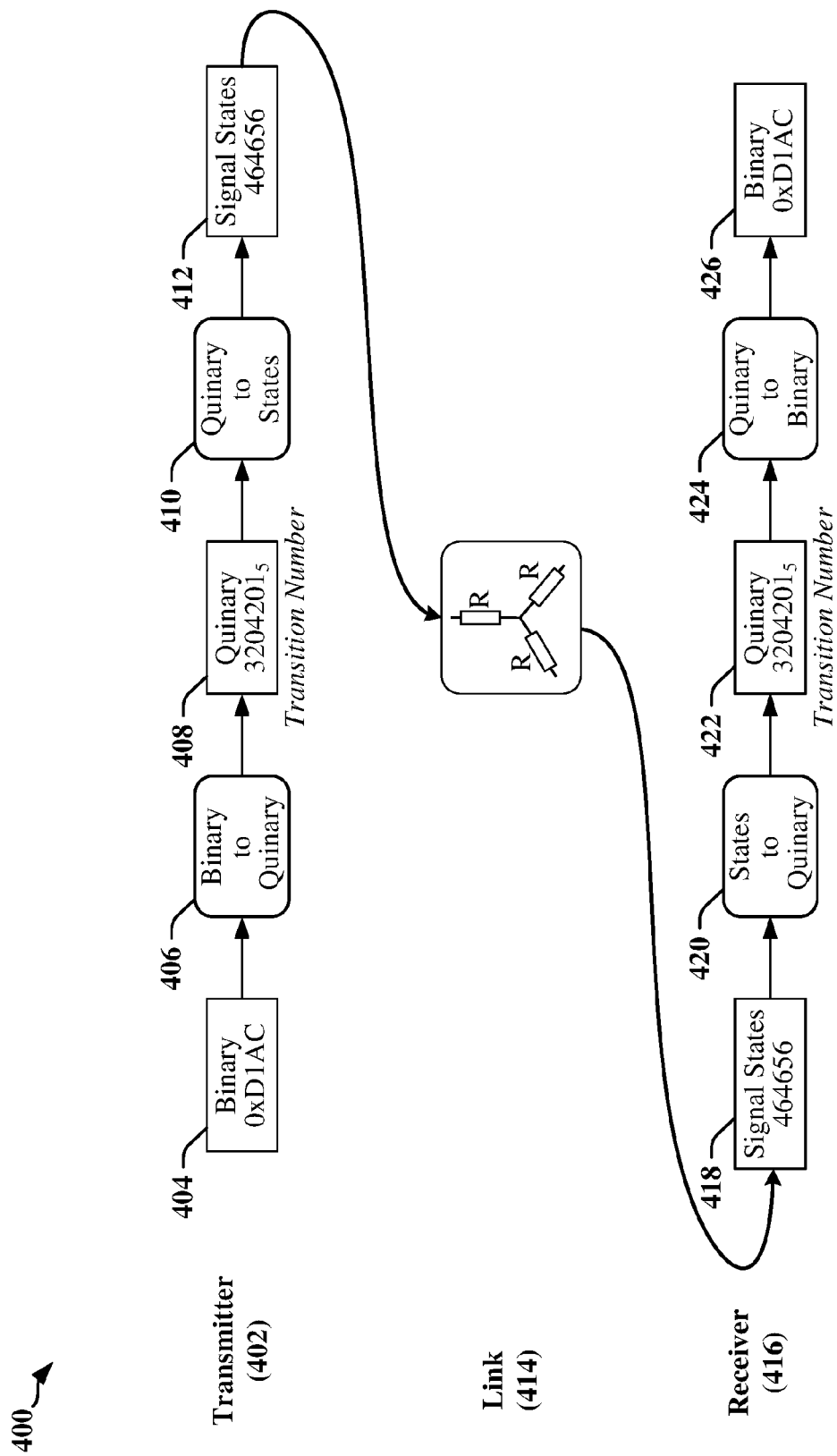
FIG. 4 illustrates data encoding, transmission and decoding in an N! multi-wire interface.

FIG. 4 is a data flow diagram that illustrates certain aspects of encoding at a transmitter 402, transmission over a basic N! multi-wire communication link 414, and decoding at a receiver 416. In the example, a binary word 404 provided to the transmitter 402 may be expressed as the hexadecimal value 0xD1AC. A binary-to-quinary encoder 406 may be configured to convert the binary word 404 to a quinary transition number 408. In the example, the transition number 408 has the quinary value 3204201. The transition number 408 is provided to a line encoder 410 that generates a sequence of symbols 412, each symbol in the sequence of symbols 412 representative of the signaling state of the wires of the communication link 414. Each digit of the transition number 408 is encoded as a difference in the signaling state of the wires in consecutive symbol transmission intervals. In one example, each of the possible symbols, corresponding to the possible signaling states, may be indexed by a single-digit quinary number. A currently transmitted symbol may be represented by the index value $S_{Current}$, and the index value $S_{Next}$ of the next symbol may be calculated as $S_{Next}=S_{Current}+T \pmod 5$, where T represents the value of a corresponding digit of the transition number.

At the receiver 416, a sequence of symbols 418 may be converted to a quinary transition number 422 by a line decoder 420. The transition number 422 may then be provided to a quinary-to-binary decoder 424, which produces the output binary data word 426. The line decoder 420 observes the difference is signaling states between two consecutive symbols, and may generate a digit of the quinary transition number 422 using the same indexing scheme used by the transmitter 402.

Example of a Two-Wire Transition-Encoded Serial Interface

Figure 5:
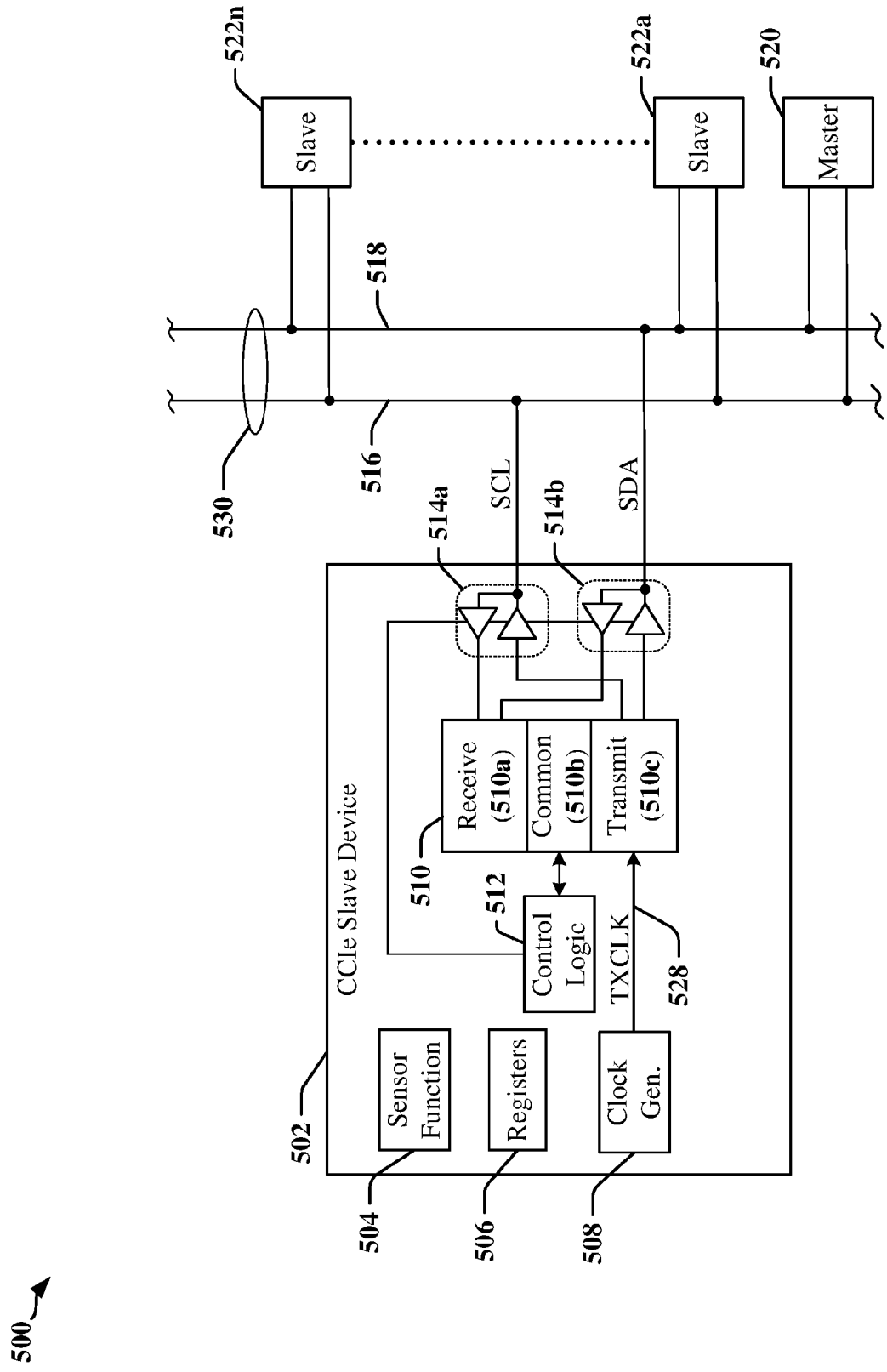
FIG. 5 illustrates a system architecture for an apparatus employing a CCIe data link used for communicating between IC devices.

FIG. 5 is a diagram illustrating certain aspects of an apparatus 500 in which multiple devices 502, 520, 522a-522n are interconnected by a communication link. The apparatus 500 may be embodied in a mobile communication device, a mobile telephone, a mobile computing system, a cellular telephone, a wearable computing device (e.g., a smart watch, a health or fitness tracker, eyewear, etc.), a notebook computer, a tablet computing device, a media player, a gaming device, an appliance, a sensor, a security device, a vending machine, a smart meter, a drone, a multicopter, or the like. The multiple devices 502, 520 and 522a-222n of the apparatus 500 may be adapted to communicate over a serial bus 530 such as a CCI bus using transition encoding. Data to be transmitted over the serial bus 530 may be encoded in ternary numbers used to select symbols to be transmitted in successive transmission intervals on the serial bus 530. In one example, the multiple devices 502, 520 and 522a-222n may communicate using a CCIe protocol. In another example, the multiple devices 502, 520 and 522a-222n may communicate using an I3C protocol. The use of transition encoding can extend the capabilities of a serial bus 530 that supports conventional CCI or I2C protocols for devices that are configured to use enhanced features including transition encoding. For example, transition encoded transmissions on the serial bus 530 may offer a higher bit rate than the bit rate achieved on a conventional CCI bus. According to certain aspects disclosed herein, CCIe protocols may be configured or adapted to support bit rates of 16.7 Mbps or more, and in some versions of the CCIe protocols may support data rates of at least 23 megabits per second.

In the example illustrated in FIG. 5, an imaging device 502 is configured to operate as a slave device on the serial bus 530. The imaging device 502 may be adapted to provide a sensor control function 504 that manages an image sensor, for example. In addition, the imaging device 502 may include configuration registers 506 or other storage, control logic 512, a transceiver 510 and line drivers/receivers 514a and 514b. The control logic 512 may include a processing circuit such as a state machine, sequencer, signal processor or general-purpose processor. The transceiver 510 may include a receiver 510a, a transmitter 510c and common circuits 510b, including timing, logic and storage circuits and/or devices. In one example, the transmitter 510c encodes and transmits data based on timing provided by a clock generation circuit 508.

Figure 6:
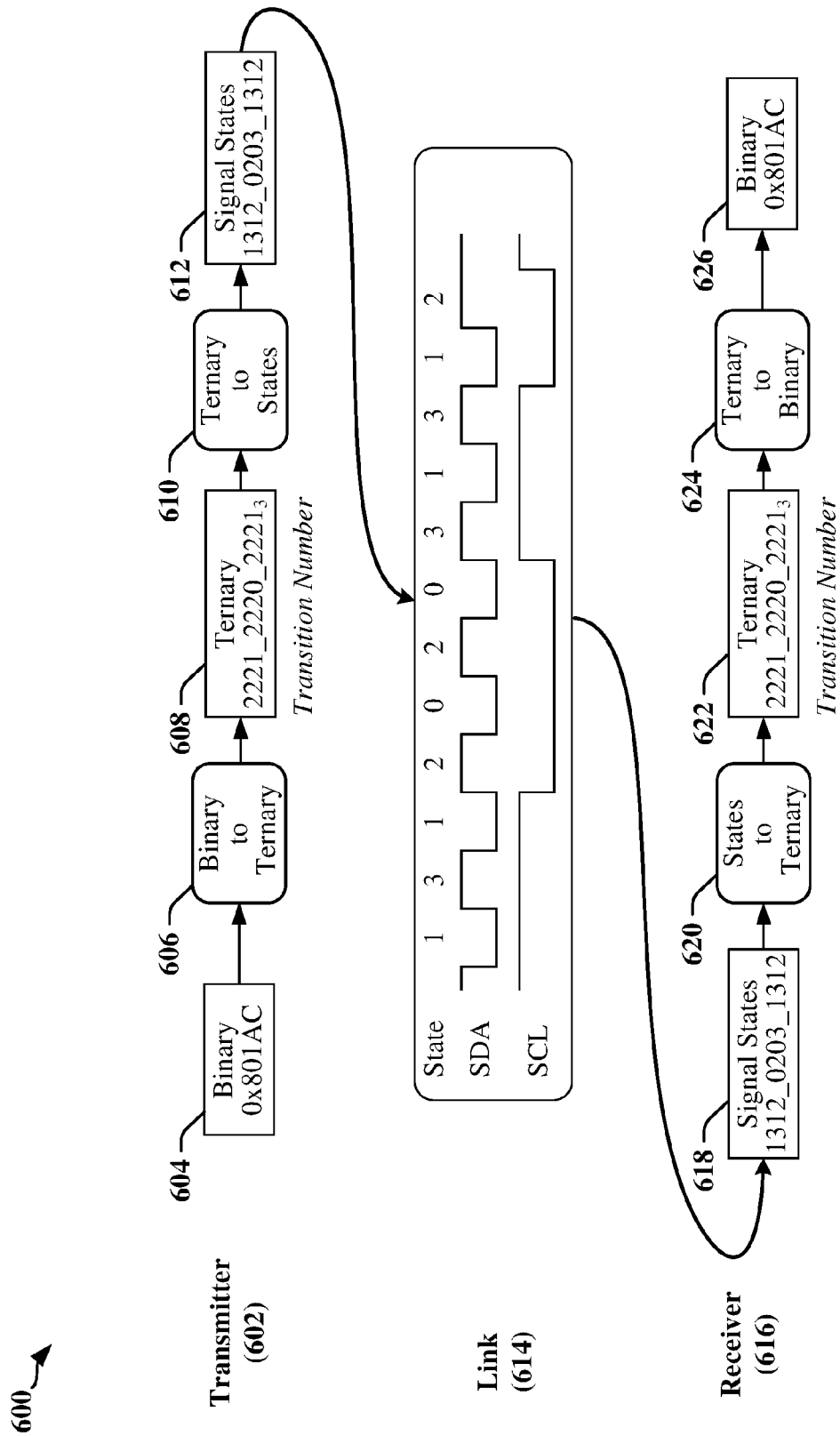
FIG. 6 illustrates data encoding, transmission and decoding in a CCIe data link.

FIG. 6 is a data flow diagram that illustrates certain aspects of transition encoding at a transmitter 602, transmission over multi-wire communication link 614, and decoding at a receiver 616. In the example, a binary word 604 provided to the transmitter 602 may be expressed as the hexadecimal value 0x0801AC. A binary-to-ternary encoder 606 may be configured to convert the binary word 604 to a ternary transition number 608. In the example, the transition number 608 has the ternary value 2221_2220_2221. The transition number 608 is provided to a line encoder 610 that generates a sequence of symbols 612, each symbol in the sequence of symbols 612 representative of the signaling state of the wires of the communication link 614. Each digit of the transition number 608 is encoded as a difference in the signaling state of the wires in consecutive symbol transmission intervals. In one example, each of the possible symbols, corresponding to the possible signaling states, may be indexed by a single-digit ternary number. A currently transmuted symbol may be represented by the index value $S_{Current}$, and the index value $S_{Next}$ of the next symbol may be calculated as $S_{Next}=S_{Current}+T$ (mod 3), where T represents the value of a corresponding digit of the transition number.

At the receiver 616, a sequence of symbols 618 may be converted to a ternary transition number 622 by a line decoder 620. The transition number 622 may then be provided to a ternary-to-binary decoder 624, which produces the output binary data word 626. The line decoder 620 observes the difference is signaling states between two consecutive symbols, and may generate a digit of the ternary transition number 622 using the same indexing scheme used by the transmitter 602. Converting between numeral systems may be referred to as transcoding, including converting between binary and ternary numbers for example.

State-Based Clock and Data Recovery

Figure 7:
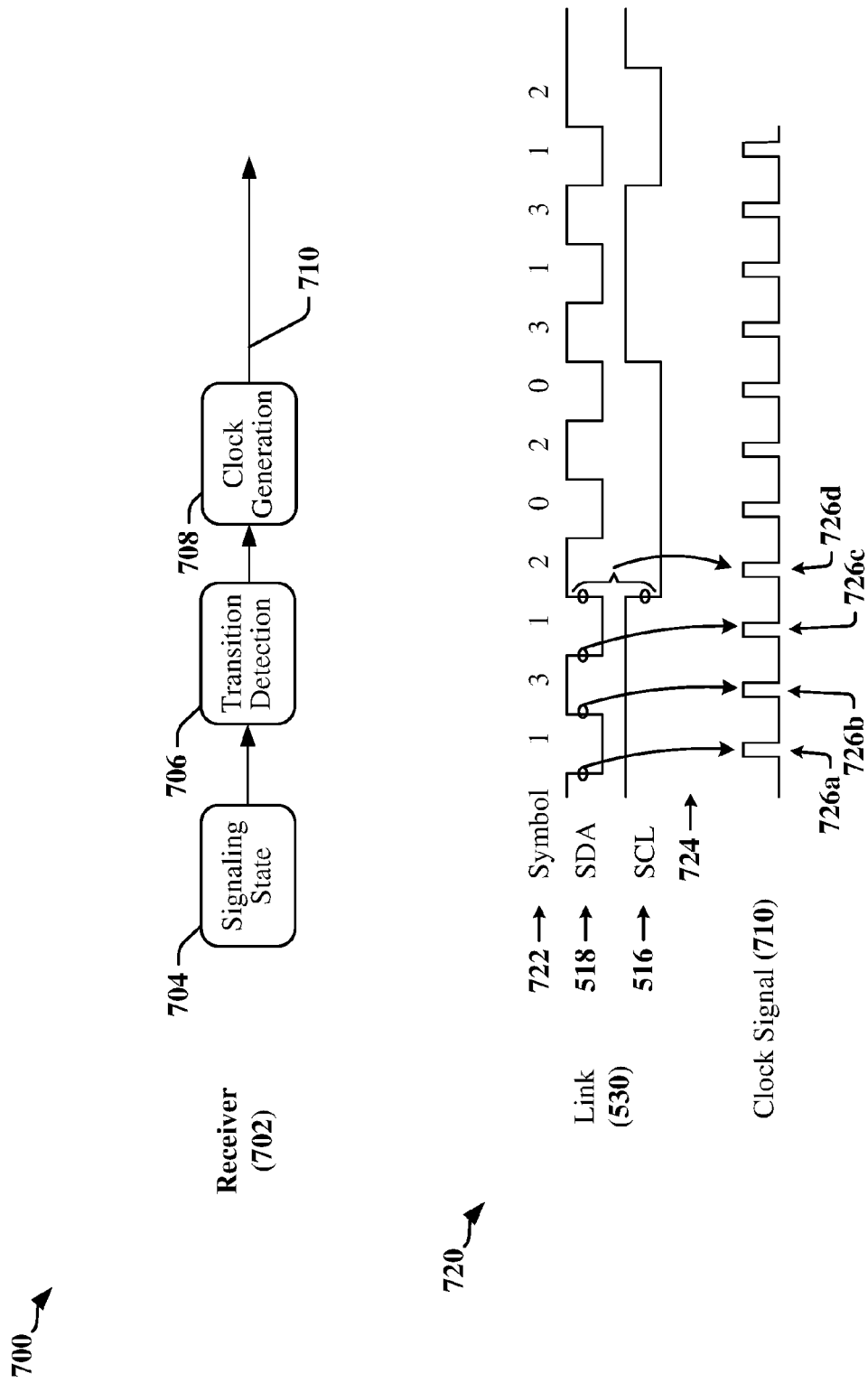
FIG. 7 illustrates clock generation in a CCIe data link.

FIG. 7 illustrates an example of clock generation in a transition-encoded interface. The examples illustrated in FIGS. 7-9 relate to the example of a transition-encoded serial bus 530 of FIG. 5, for purposes of illustration only. The principles described herein can be applied to other transition-encoded interfaces, including the N! interfaces described herein. A receiver 702 may detect or capture the signaling state 704 of the wires 516, 518 in a serial link such as the serial bus 530. The signaling state 704 is monitored by a transition detection circuit 706 configured to detect transitions in the signaling state 704. The transition detection circuit 706 may produce transition signals that can be processed by clock generation circuitry 708 to obtain a receive clock signal 710 that may be used to capture the signaling state of the wires 516, 518 during each symbol transmission interval.

As illustrated by the timing diagram 720, the symbol numbers 722 generated by the line encoder (see the line encoder 610 in FIG. 6, for example) correspond to signaling states of the SDA wire 518 and SCL wire of the serial bus 530. The transition detection circuit 706 may produce one or more indications 724 corresponding to detected transitions in the signaling state of the wires 516, 518. These indications may include signals that are processed to produce pulses 726a-726d on the clock signal 710.

Figure 8:
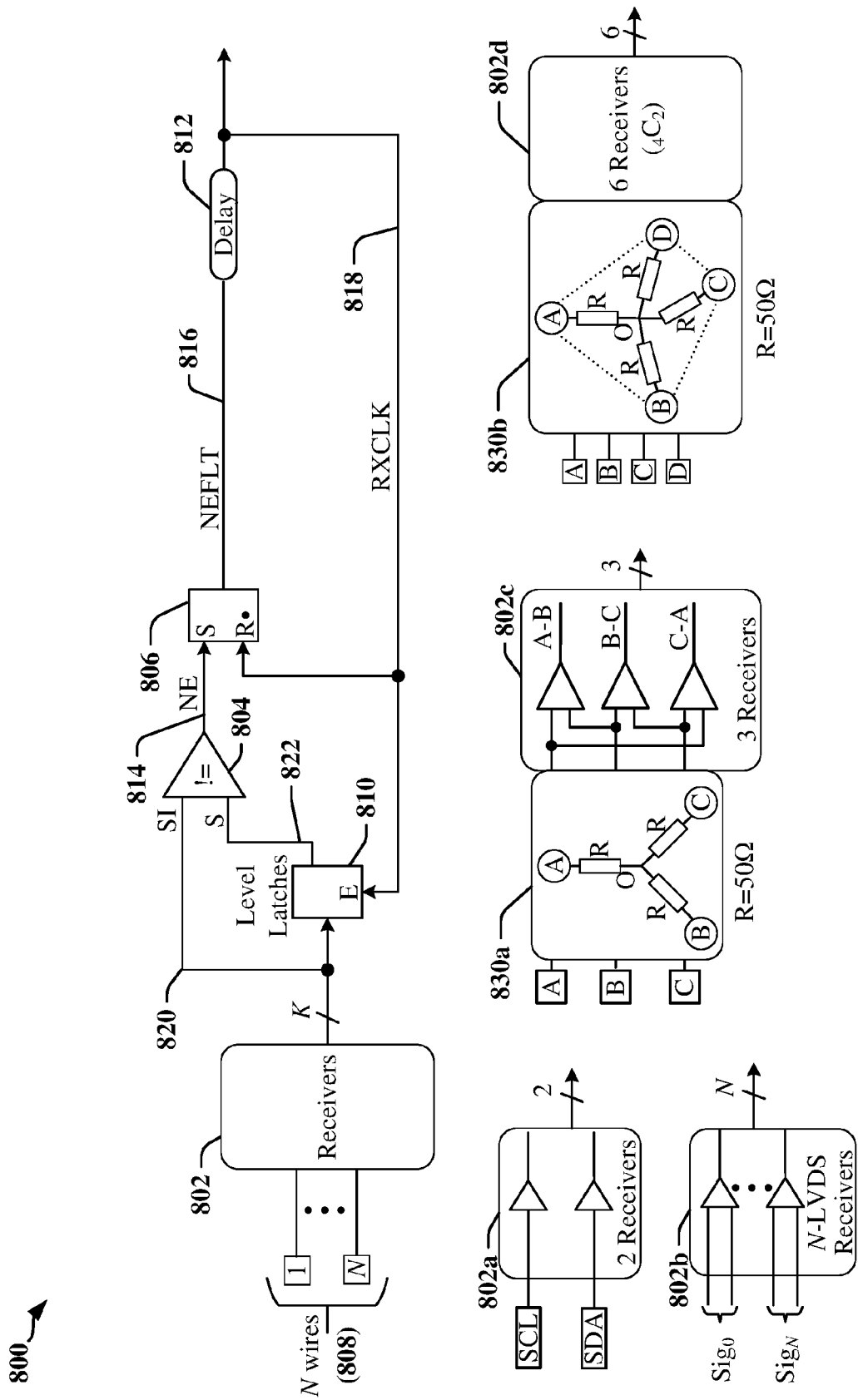
FIG. 8 illustrates a clock and data recovery circuit that may be used in a transition encoded communication interface.
Figure 9:
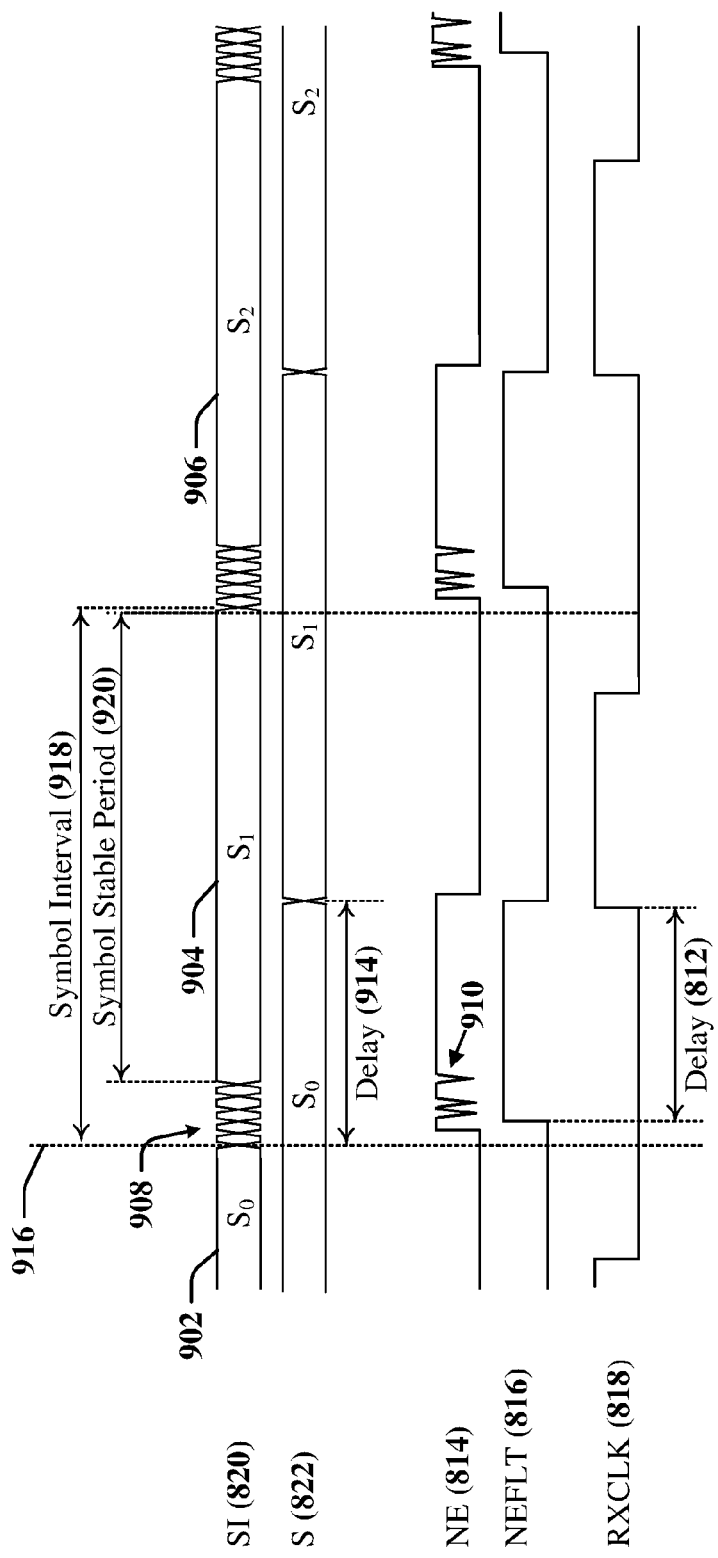
FIG. 9 illustrates timing of certain signals associated with the clock and data recovery circuit of FIG. 8, in accordance with one or more aspects disclosed herein.

FIG. 8 illustrates an example of a clock and data recovery (CDR) circuit 800 that may be employed to recover embedded clock information in an N-wire system. FIG. 9 is a timing diagram 900 illustrating certain signals generated through the operation of the CDR circuit 800. The CDR circuit 800 and its timing diagram 900 are provided by way of generalized example, although other variants of the CDR circuit 800 and/or other CDR circuits may be used in some instances. Signals received from N wires 808 are initially processed by a number of receivers 802, which produce a corresponding number of raw signals as outputs. In one example, N=4 wires 808 are processed by $_4C_2=6$ receivers 802 that produce a first state transition signal (the SI signal 820) that includes 6 raw signals representative of the received symbol. In another example, symbols transmitted over N=2 wires 808 of a two-wire, transition-encoded interface may be received by two receivers 802. For each raw signal output from each different receiver there may be a period of time between symbols $S_0$ 902 and $S_1$ 904 during which the state of the corresponding signal is undefined, indeterminate, or otherwise unstable and may result in transients or glitches 908. Level latches 810, a comparator 804, set-reset latch 806, a delay element 812 and (bused) level latches 810 may be configured to output a level-latched signal (the S signal 822) representative of a delayed instance of the SI signal 820, where the delay before the SI signal 820 is captured by the level latches 810 to provide an updated S signal 822 may be selected by configuring the delay element 812.

The comparator 804 compares the SI signal 820 with the S signal 822 and outputs a binary comparison signal (the NE signal 814). The set-reset latch 806 may receive the NE signal 814 from the comparator 804 and output a signal (the NEFLT signal 816), which is a filtered version of the NE signal 814. The operation of the set-reset latch 806 can be configured to remove any transient instability in the NE signal 814, where the transient instability is exhibited as spikes 910 in the NE signal 814. The "Reset" input of the set-reset latch 806 may be prioritized such that the NEFLT signal 816 is reset when the RXCLK signal 818 is high, regardless of the state of the NE signal 814.

In some instances, the RXCLK signal 818 may be used by external circuitry to sample the data output 828 of the CDR circuit 800. In one example, the RXCLK signal 818, or a derivative signal of the RXCLK signal 818 may be provided to decoder or deserializer circuits. In some instances, other signals 816 may be used to generate a clock signal for external circuitry. The level latches 810 receive the SI signal 820 and output the S signal 822, where the level latches 810 are triggered or otherwise controlled by the RXCLK signal 818. In one example, the S signal 822 may serve as the symbols output of the CDR circuit 800. In other examples, additional circuitry may be included in the CDR circuit 800 to delay, latch and/or otherwise condition the S signal 822 for use as the symbols output of the CDR circuit 800.

In operation, the comparator 804 compares the SI signal 820 with the S signal 822, which is output from the level latches 810. The comparator 804 drives the NE signal 814 to a first state (e.g. logic low) when the SI signal 820 and the S signal 822 are equal, and to a second state (e.g. logic high) when the SI signal 820 and the S signal 822 are not equal. The NE signal 814 is in the second state when the SI signal 820 and the S signal 822 are representative of different symbols. Thus, the second state indicates that a transition is occurring.

As can be appreciated from the timing diagram 900, the S signal 822 is essentially a delayed and filtered version of SI signal 820, in which transients or glitches 908 have been removed because of the delay 914 between the SI signal 820 and the S signal 822. Multiple transients or glitches 908 in the SI signal 820 may be reflected as spikes 910 in the NE signal 814, but these spikes 910 are masked from the NEFLT signal 816 through the operation of the set-reset circuit. Moreover, the RXCLK signal 818 is resistant to line skew and glitches in the symbol transitions based on the use of the delay element 812 provided in the feedback path to the level-latches 810 and set-reset latch 806, whereby the RXCLK signal 818 controls the reset function of the set-reset latch 806.

At the commencement 916 of a transition between a first symbol value $S_0$ 902 and a next symbol value $S_1$ 904, the SI signal 820 begins to change state. The state of the SI signal 820 may be different from $S_1$ 904 due to the possibility that intermediate or indeterminate states, including transients or glitches 908, may occur during the transition between $S_0$ 902 and $S_1$ 904. These transients or glitches 908 may be caused, for example, by inter-wire skew, over/under shoot, crosstalk, etc.

The NE signal 814 becomes high as soon as the comparator 804 detects a difference in values between the SI signal 820 and the S signal 822, and the transition high of the NE signal 814 asynchronously sets the set-reset latch 806 output, driving the NEFLT signal 816 high. The NEFLT signal 816 is maintained in its high state until the set-reset latch 806 is reset by a high state of the IRXCLK signal 818. The RXCLK signal 818 is a delayed version of the NEFLT signal 816.

The transients or glitches 908 on the SI signal 820 may represent invalid data. These transients or glitches 908 may contain a short period of the previous symbol value $S_0$ 902, and may cause the NE signal 814 to return low for short periods of time. Transitions of the SI signal 820 may generate spikes 910 on the NE signal 814. The spikes 910 are effectively filtered out and do not appear in the NEFLT signal 816.

The high state of the NEFLT signal 816 causes the RXCLK signal 818 to transition high after a delay period 840 caused by the delay element 812. The high state of RXCLK signal 818 resets the set-reset latch 806 output, causing the NEFLT signal 816 to transition to a low state. The high state of the IRXCLK signal 818 also enables the level latches 810, and the SI signal 820 value may be output on the S signal 822.

The comparator 804 detects that the S signal 822 (for symbol $S_1$ 902) matches the symbol $S_1$ 902 value present on the SI signal 820 and switches its output (the NE signal 814) low. The low state of the NEFLT signal 816 causes the IRXCLK signal 818 to go low after a delay period 842 caused by the delay element 812. This cycle repeats for each transition in the SI signal 820. At a time after the failing edge of the IRXCLK signal 818, a new symbol $S_2$ 906 may be received and may cause the SI signal 820 to switch its value in accordance with the next symbol $S_2$ 906.

The CDR circuit 800 illustrated in FIG. 8 represents one of various examples of such circuits, and the CDR circuit 800 may be adapted or configured for use in a variety of communication interfaces. In some instances, benefit may be derived from the use of other types of CDR circuit that are adapted or configured to delay or advance a sampling edge with respect to a period of time 920 during which a received symbol 904 is stable and can be reliably captured. For example, the type and/or configuration of the receivers 802 may be determined based on the signal encoding techniques employed in an interface. In a first example, a two single-ended receiver configuration 802a may be employed to receive signals from a two-wire CCIe serial bus. In a second example, a multi-wire interface may carry N LVDS signals that received by N differential receivers 802b. In a third example, a three receiver configuration 802c may be employed to compare pairs of signals received from a three-wire N! (3!) interface, which is terminated by a resistance network 830a. In a fourth example, a six receiver configuration 802d may be employed compare signals received from different combinations of two signals received on a four-wire N! (4!) encoded interface, which is terminated by a resistance network 830b.

Pulse-Based Communication Interfaces

Certain aspects disclosed herein relate to interfaces that encode data in pulses rather than in signaling state or transitions between signaling states. Pulse-based signaling may be used when signals are capacitively, inductively or optically coupled, or when a signal channel encodes information in events and does not support encoding using signaling state. In such instances, signal conversion and/or bridging may be performed to interface transition-encoded state-based interfaces with signal channels that do not carry state information.

Figure 10:
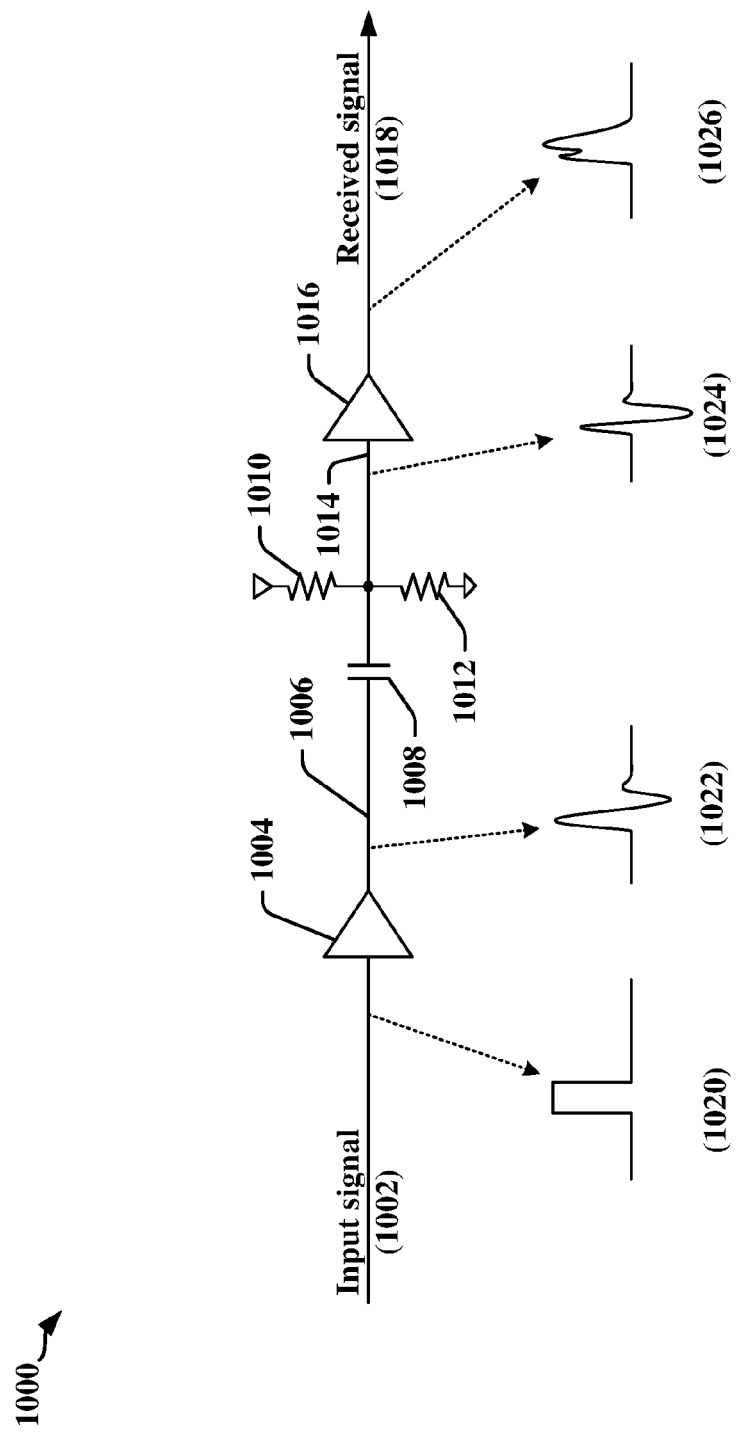
FIG. 10 illustrates certain aspects of a capacitively coupled signal.

FIG. 10 is a simplified diagram 1000 that illustrates certain aspects of pulse-based communication. A pulse 1020 may be provided as an input signal 1002 to a line driver 1004. The line driver 1004 produces a corresponding pulse 1022 on the transmission line 1006, where low-pass filtering effects associated with the transmission line 1006 may remove higher-order frequencies. Reflections and other effects may distort the transmitted pulse 1022 by introducing overshoots and/or undershoots on signal transitions. A capacitor 1008 removes the DC component from the transmitted pulse 1022, to produce a pulse 1024 centered on a DC level selected by resistors 1010, 1012. This voltage-balanced pulse 1024 may be provided to an input 1014 of a line receiver 1016, which produces a received pulse 1026 as a received signal 1018.

Multi-wire interfaces that use signaling state-based encoding may be adapted or otherwise modified to encode information in the presence or absence of a pulse during a transmission interval. Each wire of the multi-wire interface may carry a pulse during each transmission interval, and at least one wire carries a pulse during any transmission interval. A clock signal may be generated by providing an edge on the clock signal corresponding to the first-detected pulse in each transmission interval.

Figure 11:
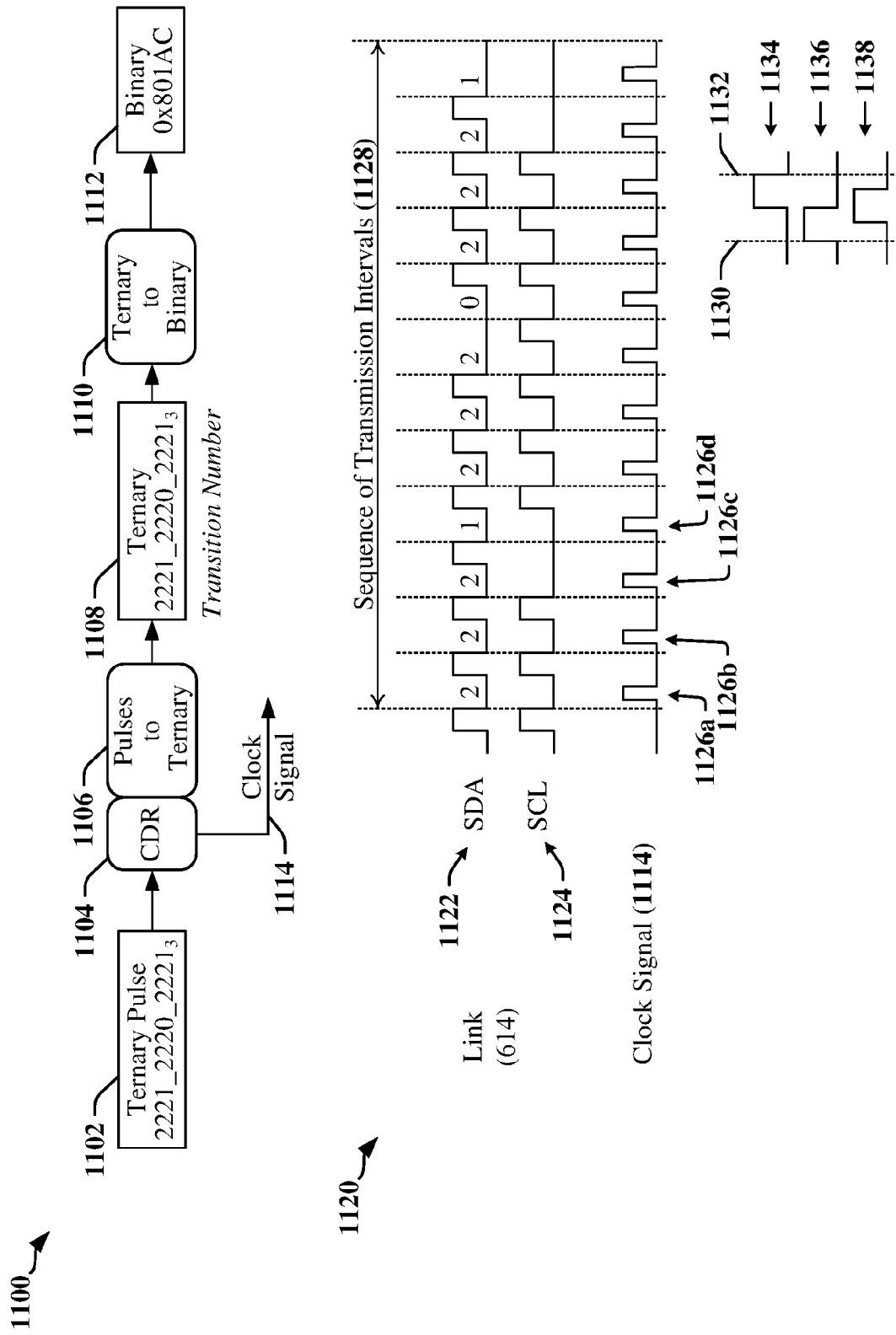
FIG. 11 illustrates certain aspects of a pulse-encoded interface in which data is communicated data over a two-wire serial link.

FIG. 11 is a diagram that illustrates certain aspects of a pulse-encoded interface 1100, where data is communicated data over a two-wire serial link. At a transmitter, binary data is encoded in symbols, each symbol being transmitted through the communication interface as pulses in one of a sequence of transmission intervals 1128. A receiver detects the transmitted pulse pattern 1102 for each transmission interval. The pulse pattern 1102 for each transmission interval may be expressed as a digit of a ternary number. The pulse pattern 1102 for each transmission interval is provided to a CDR 1104, which extracts a receive clock signal 1114 and enables a line decoder 1106 to generate a ternary number 1108 representative of the pulse patterns received during the sequence of transmission intervals 1128. A ternary-to-binary transcoder 1110 may then provide a binary word 1112 as an output.

The timing diagram 1120 illustrates reception of a data word 1112 in a sequence of transmission intervals 1128 for a two wire serial bus. Pulses may be transmitted on the SDA wire 1122 or the SCL wire 1124. A sequence of clock pulses 1126a-1126d is generated on the receive clock signal 1114 based on the occurrence of a pulse on either or both of the SDA wire 1122 or the SCL wire 1124.

In the timing diagram 1120, the pulses on the SDA wire 1122 and the SCL wire 1124 are depicted has having a 50% duty cycle. In some instances, the pulses may have a duty cycle that is greater or less than 50% such that the pulses are defined as having a high state that is longer in duration than the low state, or a high state that is shorter in duration than the low state. The timing of the pulses may also vary with respect to a temporal reference point 1130, 1132 such as an edge of a transmit clock at the transmitter. In one example 1134, the SDA wire 1122 and/or the SCL wire 1124 may remain in a low signaling state at a first-occurring reference point 1130, transitioning high when a pulse is to be transmitted such that the wire 1122 or 1124 transitions low at or near a second-occurring reference point 1132. In another example 1136, the SDA wire 1122 and/or the SCL wire 1124 may transition to a high signaling state at the a first-occurring reference point 1130 when a pulse is to be transmitted, and the wire transitions low at some point close to the mid-point between the first-occurring reference point 1130 and the second-occurring reference point 1132. In another example 1138, a pulse on the SDA wire 1122 and/or the SCL wire 1124 may be centered around a time close to the mid-point between the first-occurring reference point 1130 and the second-occurring reference point 1132, or centered on some other point in time such that the wire is in the low state for some duration of time before and after each reference point 1130, 1132. The polarity of the signaling states for each of these examples 1134, 1136, 1138 may be inverted as desired or indicated by design considerations.

Pulse-Based Clock and Data Recovery

Figure 12:
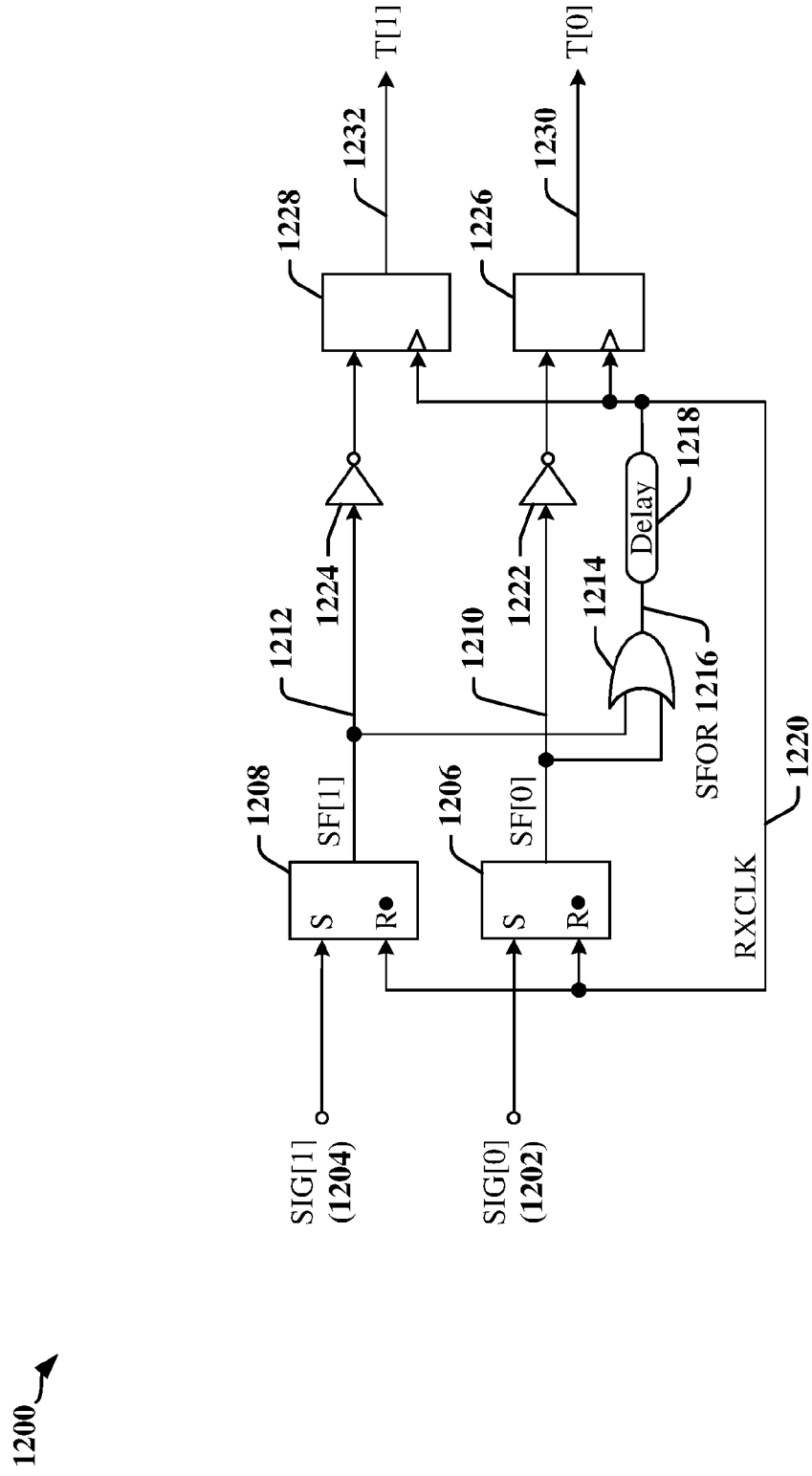
FIG. 12 illustrates a first example of a clock recovery circuit that may be used in a pulse-based interface.
Figure 13:
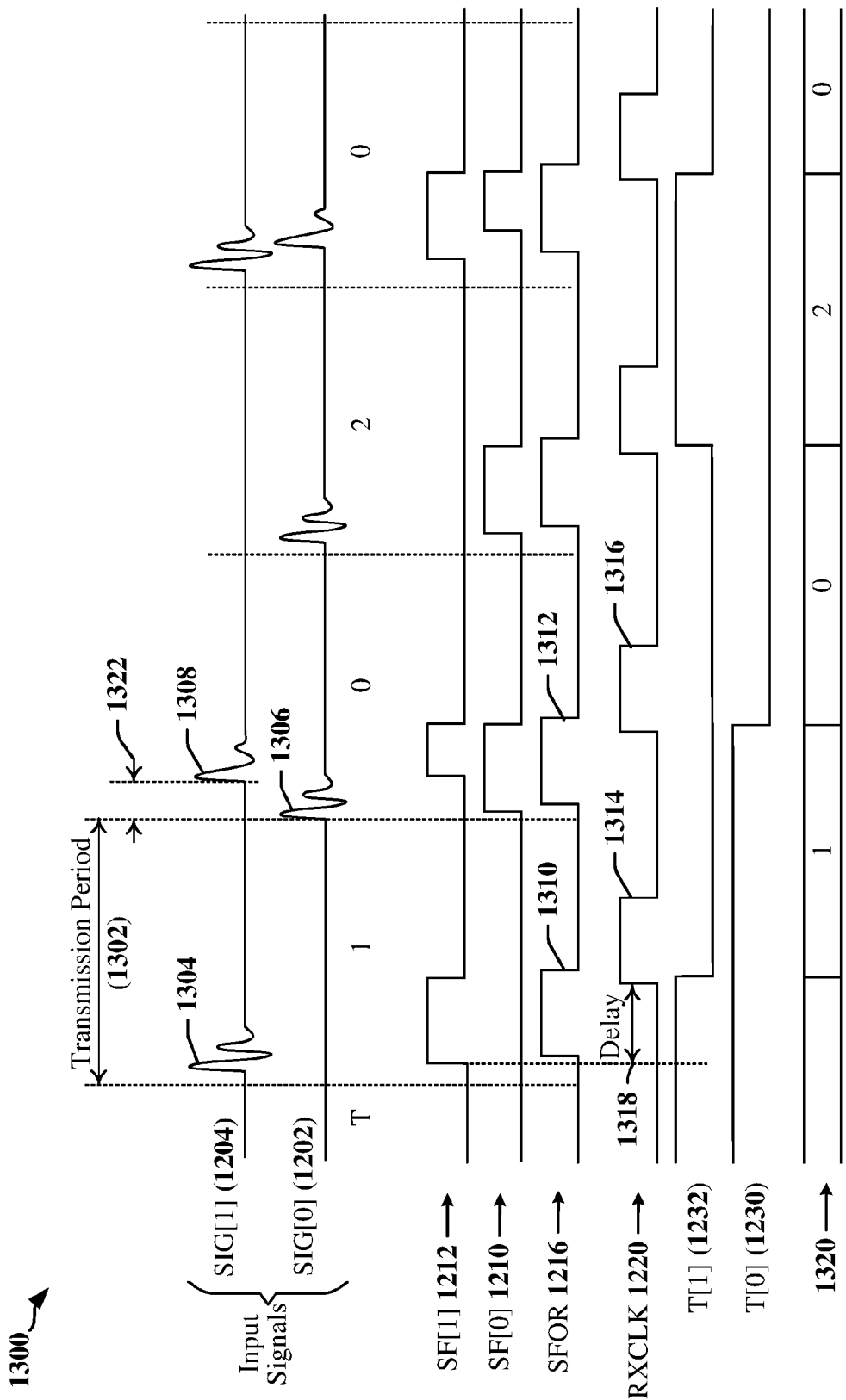
FIG. 13 is a timing diagram illustrating certain signals generated through the operation of the clock recovery circuit of FIG. 12

FIG. 12 illustrates a first example of a CDR circuit 1200 that may be used in a pulse-based interface. FIG. 13 is a timing diagram 1300 illustrating certain signals generated through the operation of the CDR circuit 1200. The example depicted in FIG. 12 relates to a two-wire communication link in order to simplify description of the CDR circuit 1200. The principles of operation apply equally to other communication links, including N-wire links where N≥2, and communication links that transmit N LVDS signals over N pairs of wires. Signals 1202 and 1204 are received from the communication link using a comparator, receiver, conditioning circuitry and the like. Each signal 1202, 1204 is provided to a set (S) input of a corresponding set-reset latch 1206, 1208. Accordingly a pulse 1306 received in the first signal 1202 sets the first set-reset latch 1206, and a pulse 1304, 1308 received in the second signal 1204 sets the second set-reset latch 1208. The output SF[0] 1210 and SF[1] 1212 are provided to an OR gate 1214 that produces an output signal (SFOR signal) 1216. Since the encoding scheme ensures that a pulse 1304, 1306, and/or 1308 is transmitted in at least one of the signals 1202, 1204 during each transmission period 1302, the SFOR signal 1216 includes a pulse 1310, 1312 for each transmission period 1302.

The SFOR signal 1216 is provided to a delay element 1218 that delays the pulses 1310, 1312 in the SFOR signal 1216 to obtain the RXCLK signal 1220 with delayed pulses 1314, 1316. The delay element 1218 may be configured to produce a delay 1318 that has a duration sufficient to ensure that each of the trailing edges of pulses 1314, 1316 on the RXCLK signal 1220 occurs after the latest possible time when the input signals 1202, 1204 have stabilized. For example, the pulses 1306, 1308 received in the signals 1202, 1204 may be subject to different propagation times such that a delay 1322 occurs between the pulses 1306, 1308. The delay 1318 associated with the delay element 1218 may operate to prevent the occurrence of multiple pulses or glitches on the RXCLK signal 1220 in the latter example. The RXCLK signal 1220 resets the set-reset latches 1206, 1208, for which the reset (R) inputs are prioritized over the set (S) inputs.

The RXCLK signal 1220 clocks a pair of output flip-flops 1226, 122S, each of which is coupled to the output of one of the set-reset latches 1206, 1208 through a corresponding inverter 1222, 1224. At the time the output flip-flops 1226, 1228 are clocked, the output of a set-reset latch 1206 or 1208 is in a set state when a pulse was received in its corresponding input signal 1202, 1204, and the output of the set-reset latch 1206 or 1208 is in a cleared state when no pulse was received in its corresponding input signal 1202, 1204. Inverted outputs of the set-reset latches 1206, 1208 may be provided to the output flip-flops 1226, 1228 to set a desired bit orientation and/or to delay transitions caused by the reset of the set-reset latches 1206, 1208 by the RXCLK signal 1220. In the example, the inverters 1222 and 1224 provided between the set-reset latches 1206, 1208 and the output flip-flops 1226, 1228 may operate as a simple form of "pulse to ternary" decoder.

The outputs 1230, 1232 of the output flip-flops 1226, 1228 may be provided to a decoder. The outputs 1230, 1232 of the output flip-flops 1226, 1228 may be processed as ternary numbers 1320.

Figure 14:
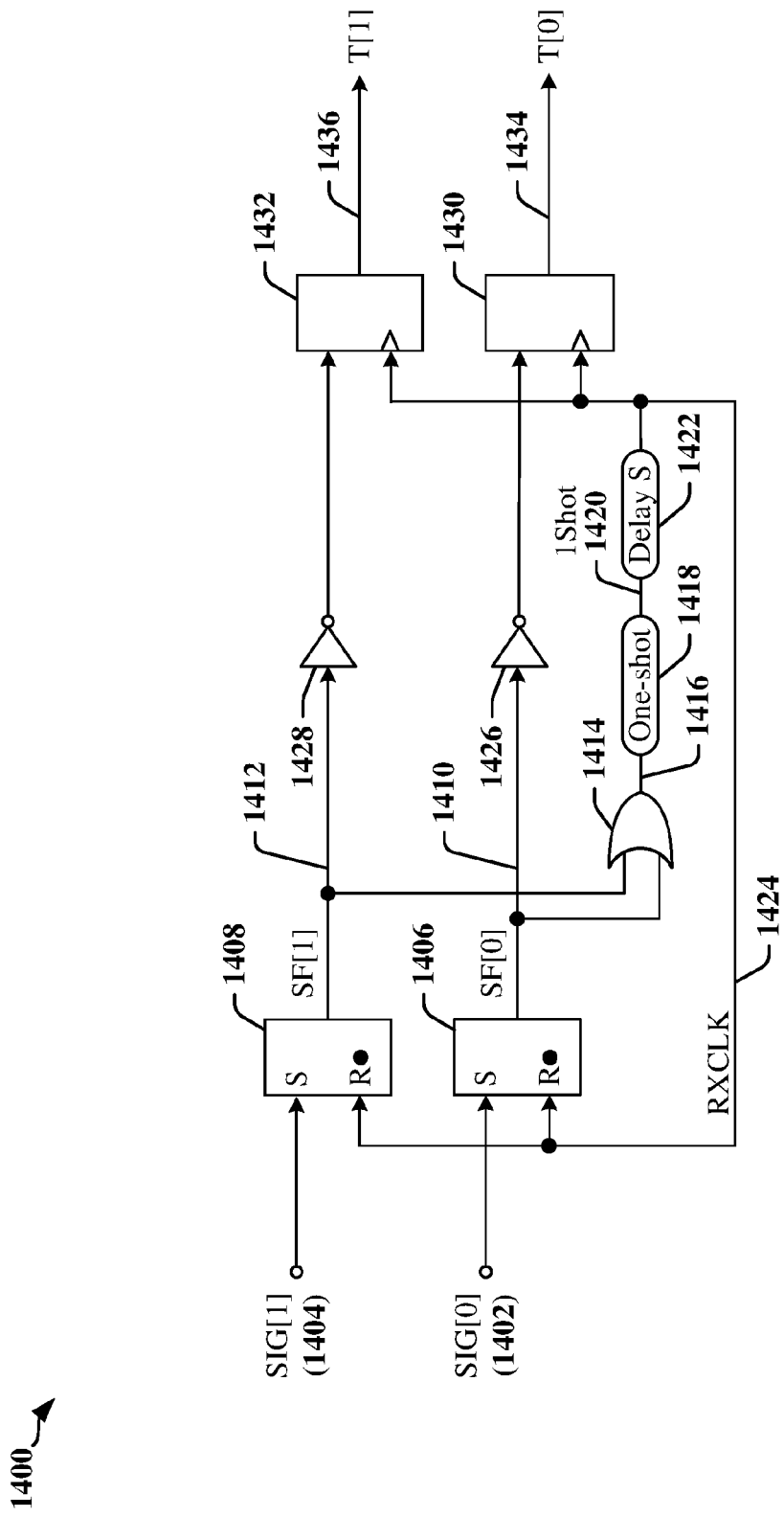
FIG. 14 illustrates a second example of a clock recovery circuit that may be used in a pulse-based interface.
Figure 15:
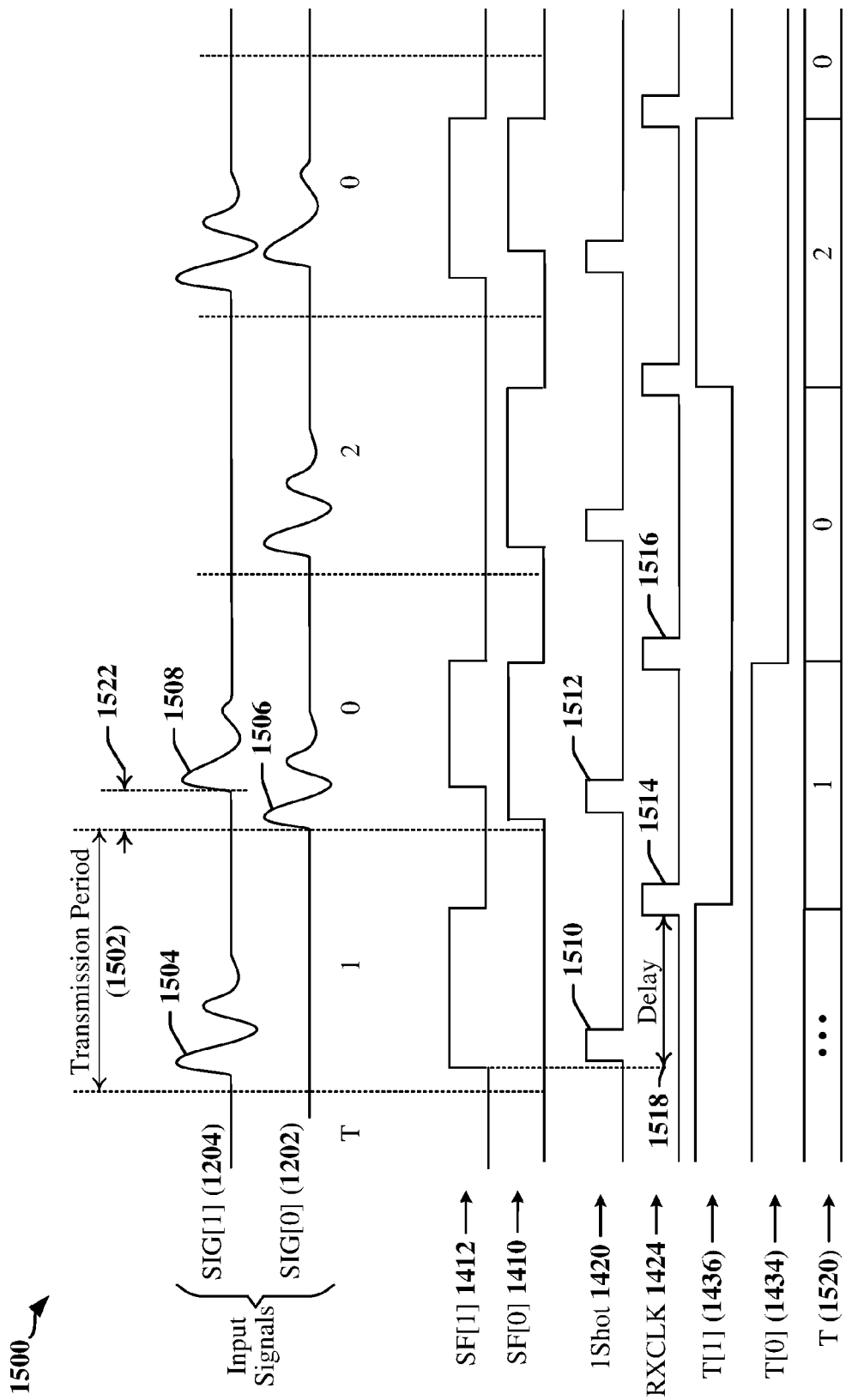
FIG. 15 is a timing diagram illustrating certain signals generated through the operation of the clock recovery circuit of FIG. 12

FIG. 14 illustrates a second example of a CDR circuit 1400 that may be used in a pulse-based interface. FIG. 15 is a timing diagram 1500 illustrating certain signals generated through the operation of the CDR circuit 1400 of FIG. 14. The example depicted in FIG. 14 enhances certain aspects of the CDR circuit 1200 depicted in FIG. 12, and also relates to a two-wire communication link in order to simplify description of the CDR circuit 1400. The principles of operation apply equally to other communication links, including N-wire links where N≥2, and communication links that transmit N LVDS signals over N pairs of wires. Signals 1402 and 1404 are received from the communication link using a comparator, receiver, conditioning circuitry and the like. Each signal 1402, 1404 is provided to a set (S) input of a corresponding set-reset latch 1406, 1408. Accordingly a pulse 1506 received in the first signal 1402 sets the first set-reset latch 1406, and a pulse 1504, 1508 received in the second signal 1404 sets the second set-reset latch 1408. The output SF[0] 1410 and SF[1] 1412 are provided to an OR gate 1414 that produces an output signal (SFOR signal) 1416. Since the encoding scheme ensures that a pulse 1504, 1506, and/or 1508 is transmitted in at least one of the signals 1402, 1404 during each transmission period 1502, the SFOR signal 1416 includes a pulse for each transmission period 1502.

The SFOR signal 1416 is provided to a one-shot circuit 1418 that produces fixed duration pulses 1510 and 1512 in its output signal (1SHOT) 1420. The pulses 1510 and 1512 correspond to pulses generated in the SFOR signal 1416. The 1SHOT signal 1420 is provided to a delay element 1422 that delays the pulses 1510, 1512 in the 1SHOT signal 1420 to obtain the RXCLK signal 1424 with delayed pulses 1514, 1516. The duration of the pulses 1510 and 1512 produced by the one-shot circuit 1418 may be configured to produce a single, fixed-length pulse with a duration that exceeds a maximum expected delay 1522 between pulses 1506, 1508 transmitted in the different input signals 1402, 1404. The delay element 1422 may be configured to produce a delay 1518 that has a duration sufficient to ensure that each of the trailing edges of pulses 1514, 1516 on the RXCLK signal 1424 occurs after the latest possible time when the input signals 1402, 1404 have stabilized. For example, the pulses 1506, 1508 received in the signals 1402, 1404 may be subject to different propagation times such that a delay 1522 occurs between the pulses 1506, 1508. The delay 1518 associated with the 1SHOT signal 1420 and/or the delay element 1422 may operate to prevent the occurrence of multiple pulses or glitches on the RXCLK signal 1424 in the latter example. The RXCLK signal 1424 resets the set-reset latches 1406, 1408, for which the reset (R) inputs are prioritized over the set (S) inputs.

The RXCLK signal 1424 clocks a pair of output flip-flops 1430, 1432, each of which is coupled to the output of one of the set-reset latches 1406, 1408. At the time the output flip-flops 1430, 1432 are clocked, the output of a set-reset latch 1406 or 1408 is in a set state when a pulse was received in its corresponding input signal 1402, 1404, and the output of the set-reset latch 1406 or 1408 is in a cleared state when no pulse was received in its corresponding input signal 1402, 1404. Inverted outputs of the set-reset latches 1406, 1408 may be provided to the output flip-flops 1430, 1432 to set a desired bit orientation and/or to delay transitions caused by the reset of the set-reset latches 1406, 1408 by the RXCLK signal 1424. In the example, the inverters 1426 and 1428 provided between the set-reset latches 1206, 1208 and the output flip-flops 1430, 1432 may operate as a simple form of "pulse to ternary" decoder.

The outputs 1434, 1436 of the output, flip-flops 1430, 1432 may be provided to a decoder. The outputs 1434, 1436 of the output flip-flops 1430, 1432 may be processed as ternary numbers 1520.

Additional Descriptions of Certain Circuits Systems and Methods

Certain aspects disclosed herein may be applied to multi-connector interfaces that include one or more connectors that carry pulse-encoded signals. FIG. 16 illustrates certain generalized examples of the use of pulse-coded signaling. In a first example 1600, each of the signals 1604, 1606, 1608 carried on a multi-connector interface is pulse encoded. That is, encoding provides a return-to-zero pulse in at least one signal 1604, 1606, and/or 1608 in each of a sequence of transmission intervals 1602. Data may be encoded in the presence or absence of a return-to-zero pulse in a signal 1604, 1606, 1608 and/or in the patterns of return-to-zero pulses provided in the signals 1604, 1606, 1608 transmitted on a multi-connector serial communication link. In the first, example 1600, three signals are illustrated, although the multi-connector interface may include any number of connectors.

In a second example 1610, one or more signals (here, two signals 1614, 1616) carried on a multi-connector interface is pulse encoded, while information is encoded in signaling state of one or more other signals 1618 during each of a sequence of transmission intervals 1612. In some instances, information may be encoded in transitions in signaling state of one or more signals 1618 that are not pulse encoded.

In some instances, a multi-connector interface may employ transcoding to convert data to combinations of pulses transmitted on the signals 1604, 1606, and/or 1608 in the first example 1600, or to convert data to combinations of pulses transmitted on the signals 1614, 1616 and/or 1618 in the second example 1610.

Figure 17:
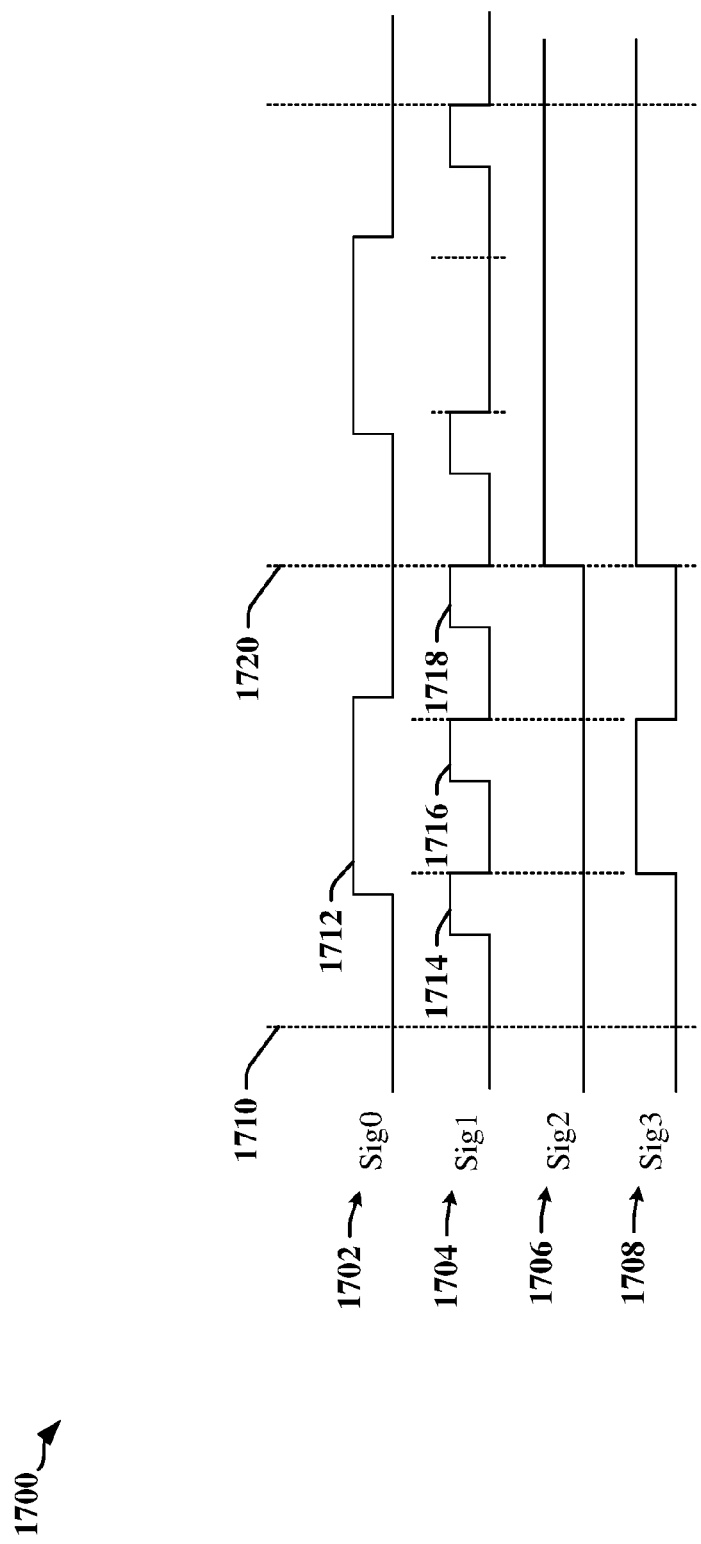
FIG. 17 is a first diagram illustrating different types of signals that may be transmitted on a communication interface in accordance with certain aspects disclosed herein.

FIG. 17 is a timing diagram 1700 illustrates a first set of examples of different types of signals 1702, 1704, 1706, 1708 that may be transmitted on a multi-wire communication interface in accordance with certain aspects disclosed herein. The multi-wire communication interface may be adapted to carry one of the types of signals 1702, 1704, 1706, 1708 on all wires or connectors, or to carry some combination of the types of signals 1702, 1704, 1706, 1708 on different connector or wires. In some instances, the multi-wire communication interface may be reconfigurable such that different combinations or types of signals 1702, 1704, 1706, 1708 may be used for signaling at different times.

A first type of signal 1702 may represent a return-to-zero (RZ) or pulse-encoded mode of signaling, as illustrated in the example 1600 of FIG. 16 (for example). A pulse 1712 may be provided within an interval delineated by a start point 1710, and an end point 1720, which may correspond to transmit clock edges or the like. As illustrated by the examples 1134, 1136 and 1138 of FIG. 11, the pulse 1712 may be positioned within the start point 1710 and end point 1720, or may have an edge coincident with the start point 1710 or the end point 1720. Information may be encoded in the presence or absence of a pulse 1712 between the start point 1710 and end point 1720. In this example, the period between the start point 1710 and end point 1720 may correspond to a single symbol interval.

A second type of signal 1704 may represent a return-to-zero or pulse-encoded mode of signaling where multiple pulses 1714, 1716, 1718 may be provided within an interval delineated by the start point 1710, and the end point 1720, which may correspond to a transmit clock edges or the like. Edges of one or more pulses 1714, 1716, 1718 may be positioned within the start point 1710 and end point 1720, or may be coincident with the start point 1710 and/or the end point 1720. Information may be encoded in the presence or absence of the pulses 1714, 1716, 1718, and/or in the combination of pulses 1714, 1716, 1718 transmitted between the start point 1710 and end point 1720, and/or the combination of pulses transmitted on different wires of the multi-wire communication interface. The number of pulses 1714, 1716 positioned within the start point 1710 and end point 1720 may be selected based on application needs or designer preference, in this example, the period between the start point 1710 and end point 1720 may correspond to a three symbol intervals.

A third type of signal 1706 may represent a non-return-to-zero mode of signaling where information may be encoded in the signaling state of a wire between the start point 1710 and end point 1720, and/or the combination of states provided on different wires of the multi-wire communication interface. In this example, the period between the start point 1710 and end point 1720 may correspond to a single symbol interval, in some instances, information may be encoded in transitions of signaling state at the start point 1710 and/or the end point 1720.

A fourth type of signal 1708 may represent a non-return-to-zero mode of signaling where multiple bits of information may be encoded between the start point 1710 and end point 1720. Here, two, three or more bits may be transmitted in the signaling state of a wire and/or the combination of states provided on one or more wires of the multi-wire communication interface. In this example, the period between the start point 1710 and end point 1720 may correspond to three symbol intervals, in some instances, information may be encoded in transitions of signaling state occurring at certain points between the start point 1710 and the end point 1720.

Certain of the types of signals 1702, 1704, 1706, 1708 illustrated in FIG. 17 can produce one, two, or more toggles within one symbol cycle. A delay element of a CDR circuit 1400 (see FIG. 14) may be configured to filter the multiple toggles such that a single pulse is generated on the RXCLK signal 1424 for each symbol. When an odd number of toggles are provided in the same cycle on a signal, the flip-flops 1432, 1430 may capture opposite values from previous cycle. When an even number of toggles occur in the same cycle on a signal, the same value may be captured from the previous cycle. Odd or even may carry extra in-band information. When both odd and even numbers of toggles occur in the same cycle on a signal, a counter may be provided to count the number of toggles, and/or either rising or falling edges within a single symbol. The counters may provide additional in-band information.

Figure 18:
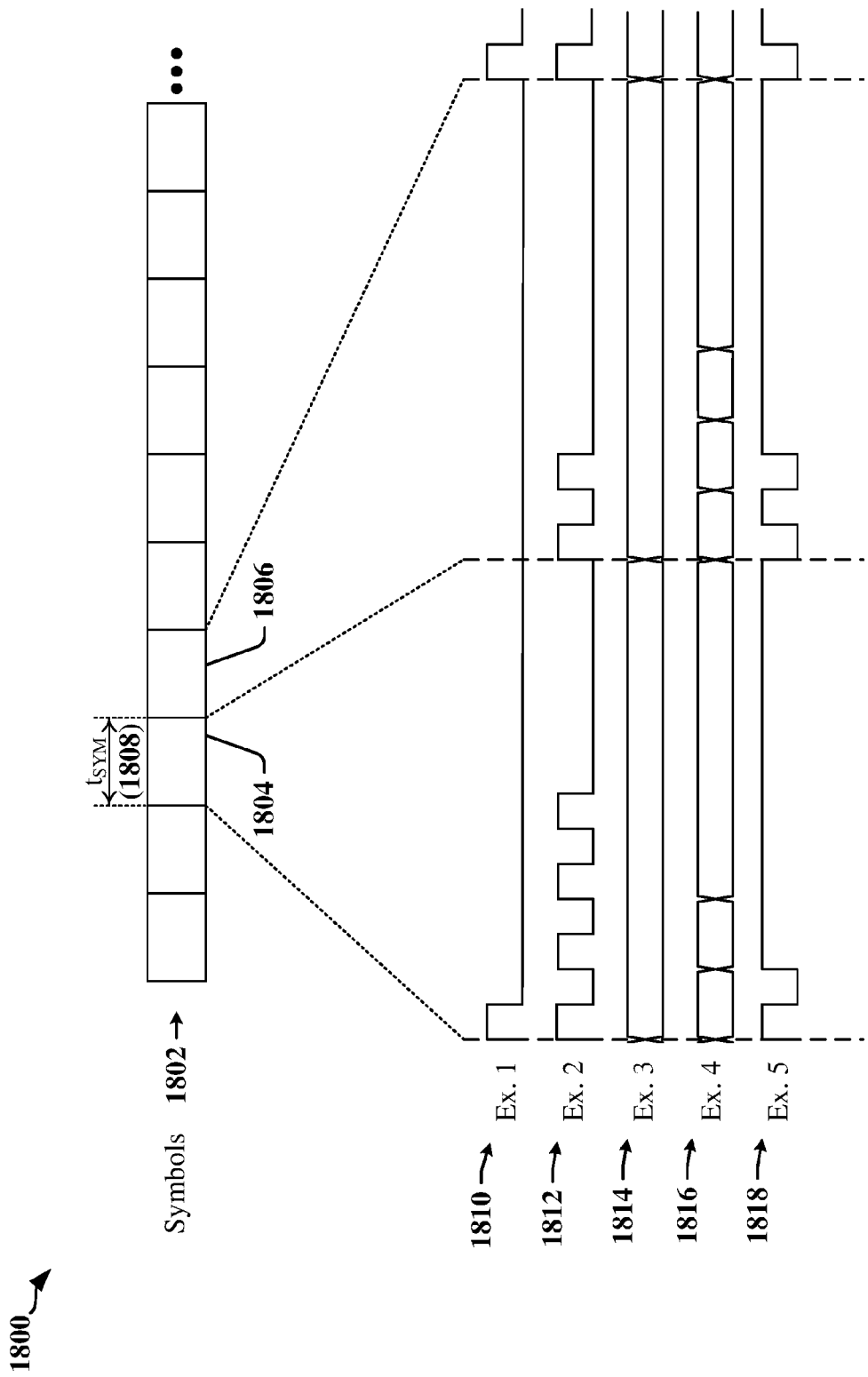
FIG. 18 is a second diagram illustrating different types of signals that may be transmitted on a communication interface in accordance with certain aspects disclosed herein.

FIG. 18 is a diagram 1800 illustrating a second set of examples of different types of signals 1810, 1812, 1814, 1816, 1818 that may be transmitted on a multi-wire communication interface in accordance with certain aspects disclosed herein. In this diagram 1800, a sequence of symbols 1802 may be transmitted one a plurality of wires using one of the types of signals 1810, 1812, 1814, 1816, 1818. Each symbol of the sequence of symbols 1802 (e.g., the symbols 1804 and 1806) occupies a symbol interval that has a duration $t_{SYM}$ 1808.

The first type of signal 1810 may use single pulse, return-to-zero (RZ) encoding where information on a wire is encoded in the presence or absence of a pulse. The second type of signal 1812 may encode data in the number of RZ pulses transmitted during a symbol interval, where the number of pulses may include zero pulses. The third type of signal 1814 may encode data in a single non-return-to-zero (NRZ) toggle where for example, a transition in signaling state at the beginning of or during a symbol interval indicates one binary value and an absence of a transition in signaling state at the beginning of or during a symbol interval indicates another binary value. The fourth type of signal 1816 may encode data in the number of NRZ toggles that occur within a symbol interval, where the number of transitions may include zero transitions. The fifth type of signal 1818 may encode data using presence, absence or number of pulses and presence or absence of a toggle. For example, the fifth type of signal 1818 may be used in a bus system that couples some devices with an input filter that filters out a short pulses. In one example, an I2C slave device may not see the short pulses within a symbol interval, but can recognize a state transition at the end of a symbol interval. Accordingly, a toggle (or no toggle) occurring at the end of a symbol interval adds state transition information observable for the I2C slave device with a spike filter. For example, a number of pulses may convey information between first group of devices, and state transition provided using a toggle at the end of the symbol interval can convey information between a second group of devices.

Figure 19:
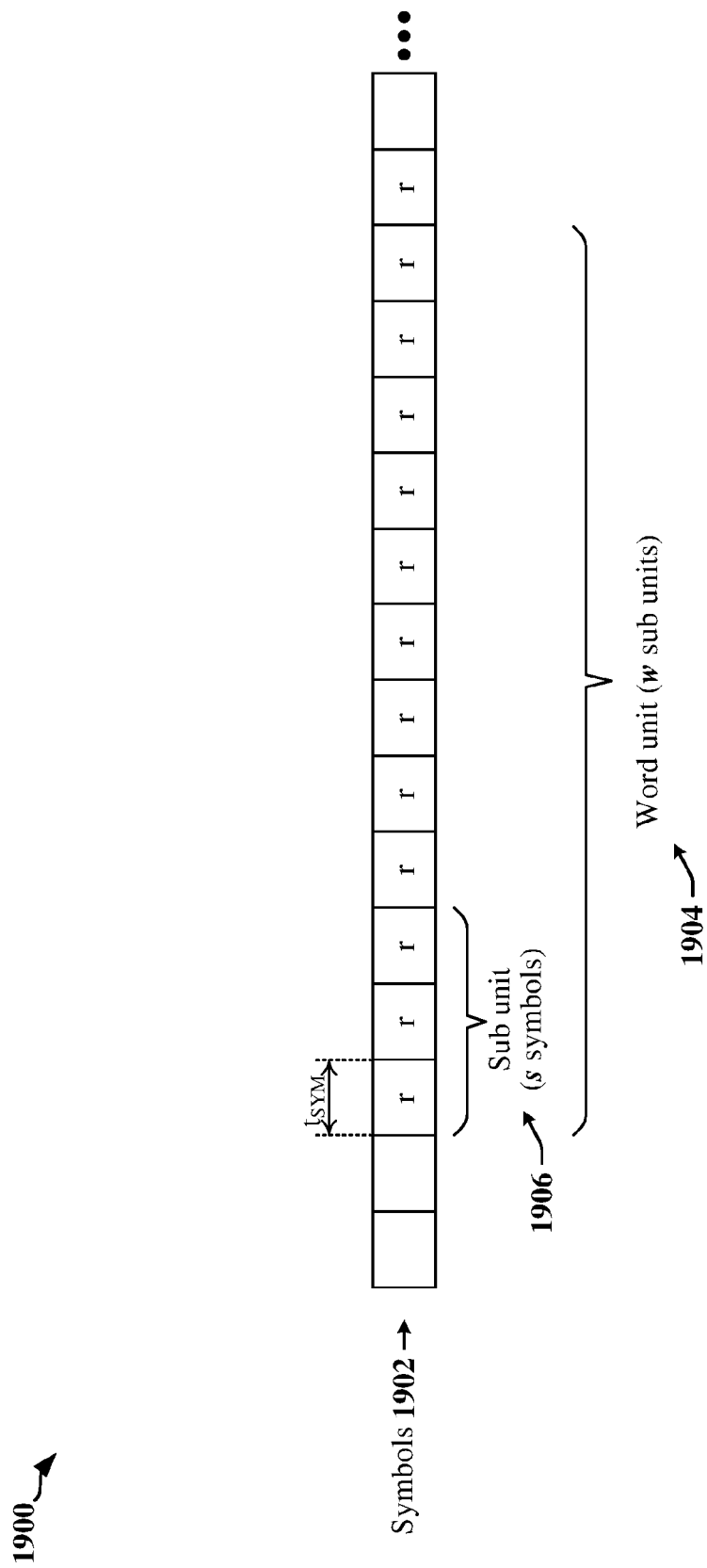
FIG. 19 illustrates encoding using different types of signals transmitted on a communication interface in accordance with certain aspects disclosed herein.

FIG. 19 is a diagram 1900 that illustrates certain aspects of encoding schemes adapted for different types of signals transmitted on a communication interface. A sequence of symbols 1902 may include a set of symbols (Word unit 1904) corresponding to a word to be transmitted over the serial link. Certain Word units 1904 may include a number (w) of sub units 1906, where each sub unit may include a number (s) of symbols. Data may be decoded from a number (r) of available states per symbol as follows:

Example 1 (CCIe)

$s = 1, w = 12, r = 3$    data $= \sum_{k=0}^{11} T_k 3^k$

Example 2 (3!)

$s = 1, w = 7, r = 5$    data $= \sum_{k=0}^{11} T_k 5^k$

Example 3

$s = 2, w = 12, r = 3$    sub = 0~7(reserve 1), data = sub[5:0]

Example 4

$s = 3, w = 12, r = 3$    sub = 0~24(reserve 2), data $= \sum_{k=0}^{3} T_k 25^k$ Example 5

$s = 3, w = 12, r = 3$    sub = 0~24(reserve 2), data = sub[3:0]

Example 6

$s = 1, w = 4, r = 7$    data $= \sum_{k=0}^{3} T_k 7^k$

Example 7

$s = 2, w = 8, r = 7$    sub = 0~31(reserve 17), data = sub[3:0]

Figure 20:
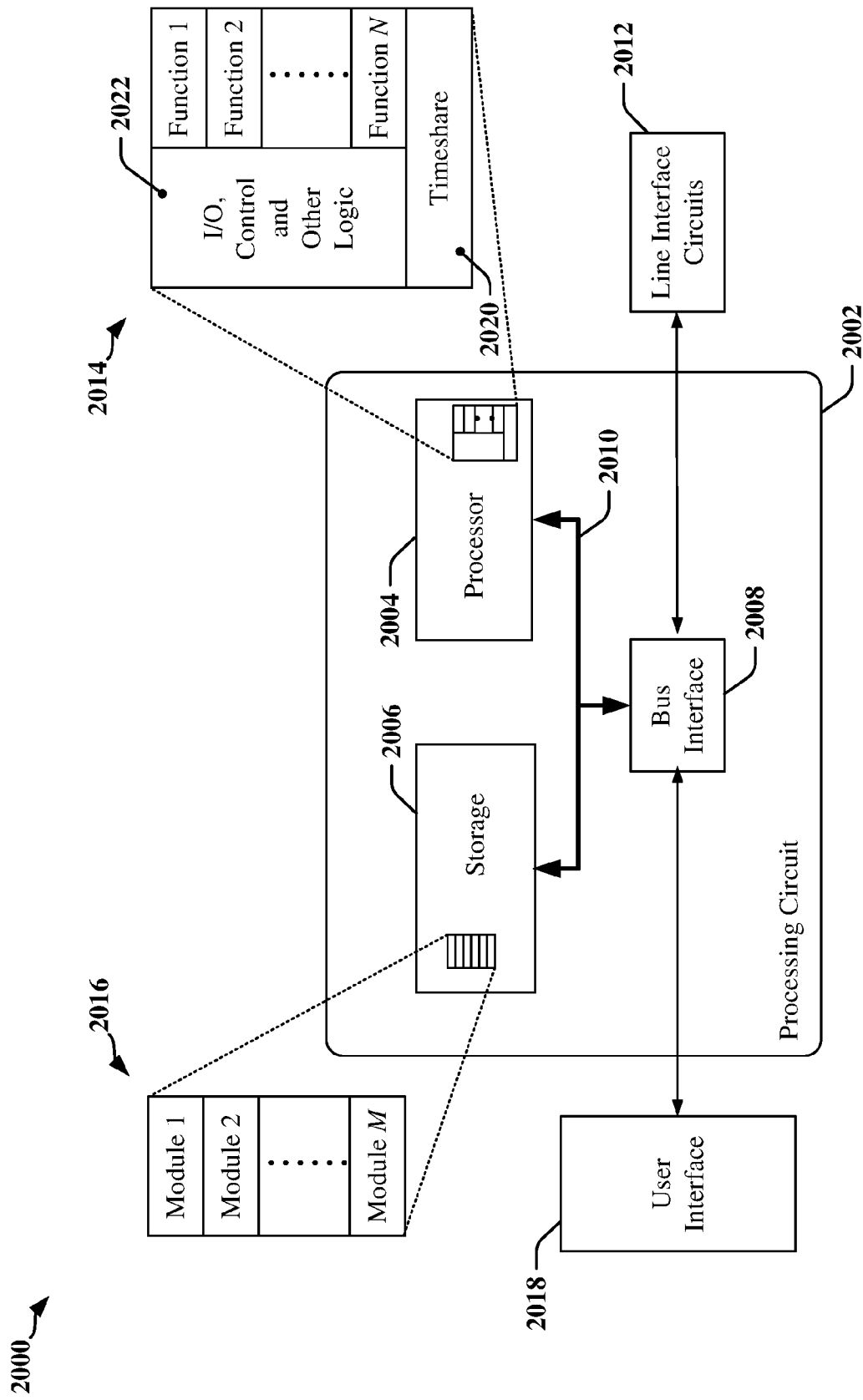
FIG. 20 is a block diagram illustrating an example of an apparatus employing a processing circuit that may be adapted according to certain aspects disclosed herein.

FIG. 20 is a conceptual diagram illustrating a simplified example of a hardware implementation for an apparatus 2000 employing a processing circuit 2002 that may be configured to perform one or more functions disclosed herein. In accordance with various aspects of the disclosure, an element, or any portion of an element, or any combination of elements as disclosed herein may be implemented using the processing circuit 2002. The processing circuit 2002 may include one or more processors 2004 that are controlled by some combination of hardware and software modules. Examples of processors 2004 include microprocessors, microcontrollers, digital signal (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 2004 may include specialized processors that perform specific functions, and that may be configured, augmented or controlled by one of the software modules 2016. The one or more processors 2004 may be configured through a combination of software modules 2016 loaded during initialization, and further configured by loading or unloading one or more software modules 2016 during operation.

In the illustrated example, the processing circuit 2002 may be implemented with a bus architecture, represented generally by the bus 2010. The bus 2010 may include any number of interconnecting buses and bridges depending on the specific application of the processing circuit 2002 and the overall design constraints. The bus 2010 links together various circuits including the one or more processors 2004, and storage 2006. Storage 2006 may include memory devices and mass storage devices, and may be referred to herein as computer-readable media and/or processor-readable media. The bus 2010 may also link various other circuits such as timing sources, timers, peripherals, voltage regulators, and power management circuits. A bus interface 2008 may provide an interface between the bus 2010 and one or more transceivers 2012. A transceiver 2012 may be provided for each networking technology supported by the processing circuit, in some instances, multiple networking technologies may share some or all of the circuitry or processing modules found in a transceiver 2012. Each transceiver 2012 provides a means for communicating with various other apparatus over a transmission medium. Depending upon the nature of the apparatus, a user interface 2018 (e.g., keypad, display, speaker, microphone, joystick) may also be provided, and may be communicatively coupled to the bus 2010 directly or through the bus interface 2008.

A processor 2004 may be responsible for managing the bus 2010 and for general processing that may include the execution of software stored in a computer-readable medium that may include the storage 2006. In this respect, the processing circuit 2002, including the processor 2004, may be used to implement any of the methods, functions and techniques disclosed herein. The storage 2006 may be used for storing data that is manipulated by the processor 2004 when executing software, and the software may be configured to implement any one of the methods disclosed herein.

One or more processors 2004 in the processing circuit 2002 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2006 or in an external computer readable medium. The external computer-readable medium and/or storage 2006 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a RAM, a ROM, a programmable read-only memory (PROM), an erasable programmable read-only memory (EPROM), an EEPROM, a register, a removable disk, and any other suitable medium for storing software and/or instructions that may be accessed and read by a computer. The computer-readable medium and/or storage 2006 may also include, by way of example, a carrier wave, a transmission line, and any other suitable medium for transmitting software and/or instructions that may be accessed and read by a computer. Computer-readable medium and/or the storage 2006 may reside in the processing circuit 2002, in the processor 2004, external to the processing circuit 2002, or be distributed across multiple entities including the processing circuit 2002. The computer-readable medium and/or storage 2006 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2006 may maintain software maintained and/or organized in loadable code segments, modules, applications, programs, etc., which may be referred to herein as software modules 2016. Each of the software modules 2016 may include instructions and data that when installed or loaded on the processing circuit 2002 and executed by the one or more processors 2004, contribute to a run-time image 2014 that controls the operation of the one or more processors 2004. When executed, certain instructions may cause the processing circuit 2002 to perform functions in accordance with certain methods, algorithms and processes described herein.

Some of the software modules 2016 may be loaded during initialization of the processing circuit 2002, and these software modules 2016 may configure the processing circuit 2002 to enable performance of the various functions disclosed herein. For example, some software modules 2016 may configure internal devices and/or logic circuits 2022 of the processor 2004, and may manage access to external devices such as the transceiver 2012, the bus interface 2008, the user interface 2018, timers, mathematical coprocessors, and so on. The software modules 2016 may include a control program and/or an operating system that interacts with interrupt handlers and device drivers, and that controls access to various resources provided by the processing circuit 2002. The resources may include memory, processing time, access to the transceiver 2012, the user interface 2018, and so on.

One or more processors 2004 of the processing circuit 2002 may be multifunctional, whereby some of the software modules 2016 are loaded and configured to perform different functions or different instances of the same function. The one or more processors 2004 may additionally be adapted to manage background tasks initiated in response to inputs from the user interface 2018, the transceiver 2012, and device drivers, for example. To support the performance of multiple functions, the one or more processors 2004 may be configured to provide a multitasking environment, whereby each of a plurality of functions is implemented as a set of tasks serviced by the one or more processors 2004 as needed or desired. In one example, the multitasking environment may be implemented using a timesharing program 2020 that passes control of a processor 2004 between different tasks, whereby each task returns control of the one or more processors 2004 to the timesharing program 2020 upon completion of any outstanding operations and/or in response to an input such as an interrupt. When a task has control of the one or more processors 2004, the processing circuit is effectively specialized for the purposes addressed by the function associated with the controlling task. The timesharing program 2020 may include an operating system, a main loop that transfers control on a round-robin basis, a function that allocates control of the one or more processors 2004 in accordance with a prioritization of the functions, and/or an interrupt driven main loop that responds to external events by providing control of the one or more processors 2004 to a handling function.

Figure 21:
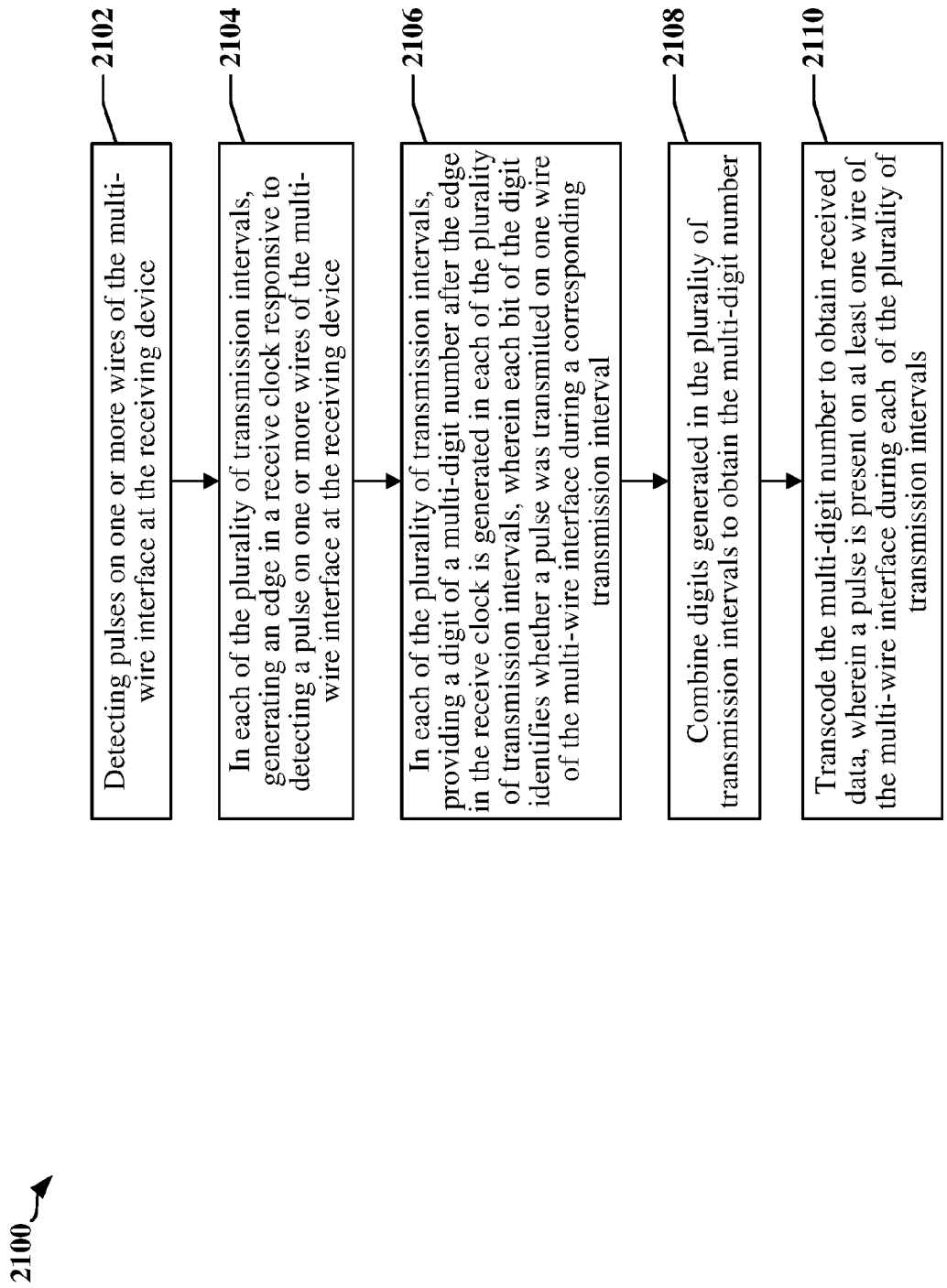
FIG. 21 is a flow chart of a method for recovering a clock signal from signals transmitted on a multi-wire communication interface according to certain aspects disclosed herein.

FIG. 21 is a flow chart 2100 of a method for recovering a clock signal from signals transmitted on a multi-wire communication interface. Data may be encoded in combinations or patterns of pulses transmitted over one or more wires of the multi-wire interface.

At block 2102, pulses are detected at a receiving device on one or more wires of the multi-wire interface.

At block 2104, an edge is generated in a receive clock in each of a plurality of transmission intervals responsive to detecting a pulse on one or more wires of the multi-wire interface. A pulse is transmitted on at least one wire of the multi-wire interface during each of the plurality of transmission intervals. The multi-wire interface may be a capacitively-coupled interface. The multi-wire interface may be an inductively-coupled interface. The multi-wire interface may be an optically-coupled interface. The pulses received on the one or more wires may be combined into a combination signal and delayed to provide the receive clock.

At block 2106, a digit of a multi-digit number is provided after the edge in the receive clock is generated in each of the plurality of transmission intervals. Each bit of the digit may identify whether a pulse was transmitted on one wire of the multi-wire interface during a corresponding transmission interval.

At block 2108, digits generated in the plurality of transmission intervals may be combined to obtain the multi-digit number. The multi-wire interface may have N wires and the multi-digit number may be expressed as a base $(2^N-1)$ number. In one example, the multi-wire interface is a two-wire interface and the multi-digit number is expressed as a ternary number. In another example, the multi-wire interface is a three-wire interface and the multi-digit number is expressed as a septenary number.

At block 2110, the multi-digit number may be transcoded to obtain received data. A data word may be encoded in the multi-digit number.

In some instances, an edge may be generated in the receive clock by combining pulses received on the one or more wires into a combination signal, providing the combination signal to one-shot logic that is configured to produce a fixed-duration pulse responsive to an edge in the combination signal, and delaying the fixed-duration pulse to provide a pulse in the receive clock.

In some examples, first information may be decoded from return-to-zero, pulse-encoded signals received from a first plurality of wires of the multi-wire interface. For example, the first information may be encoded in the presence or absence of a pulse on each of the first plurality of wires during a transmission interval. Second information may be decoded from non-return-to-zero signals received from a second plurality of wires of the multi-wire interface. Information may be transmitted in signaling states on the second plurality of wires. In one example, each wire may carry a signal that has two or more voltage or current states, and the second information may be encoded in the combination of signaling states of the second plurality of wires during a transmission interval, or transitions in signaling states of the second plurality of wires between successive transmission intervals.

Figure 22:
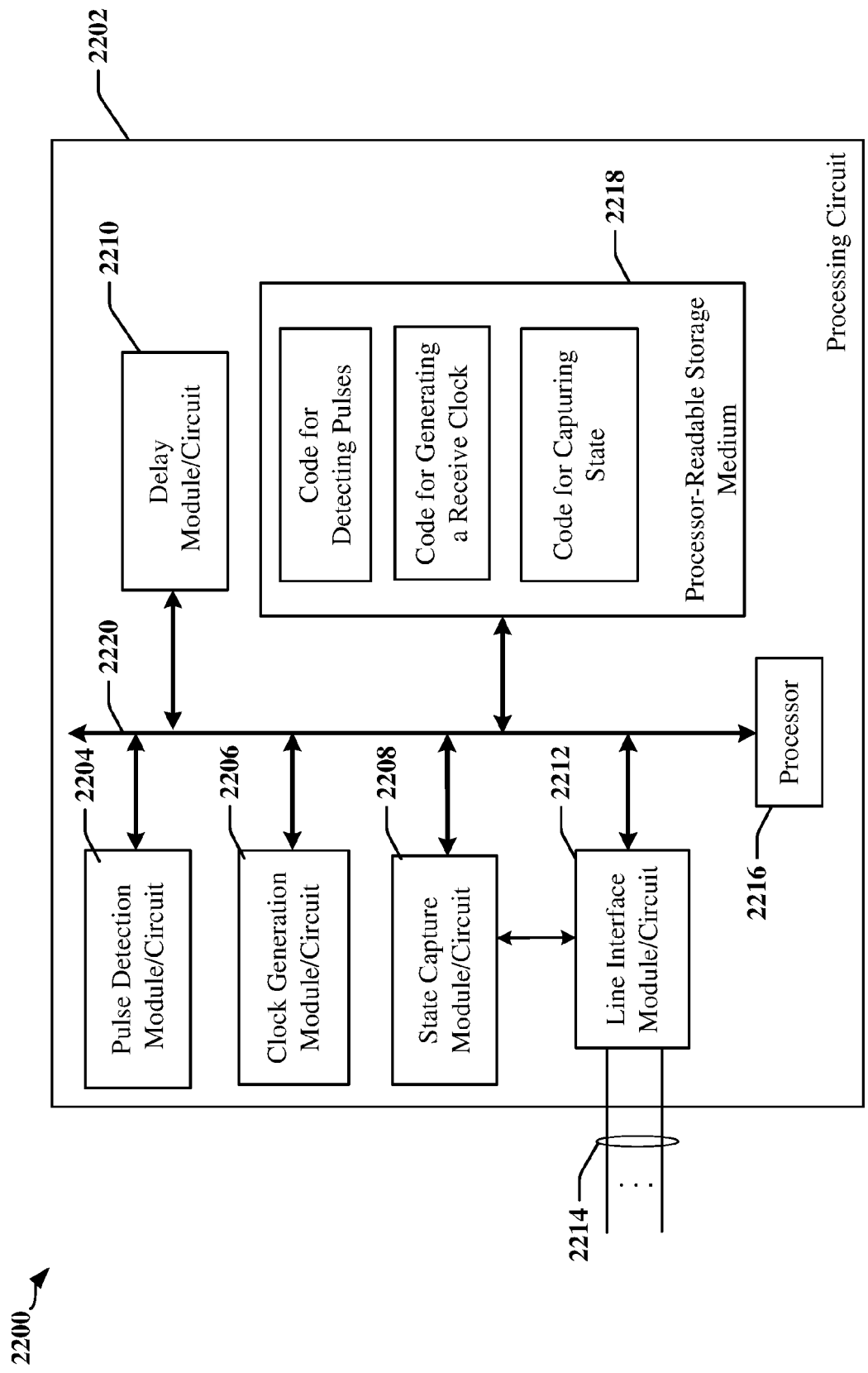
FIG. 22 is a diagram illustrating an example of a hardware implementation for a receiving apparatus employing a processing circuit adapted according to certain aspects disclosed herein.

FIG. 22 is a diagram illustrating a simplified example of a hardware implementation for an apparatus 2200 employing a processing circuit 2202. The processing circuit typically has a processor 2216 that may include one or more of a microprocessor, microcontroller, digital signal processor, a sequencer and a state machine. The processing circuit 2202 may be implemented with a bus architecture, represented generally by the bus 2220. The bus 2220 may include any number of interconnecting buses and bridges depending on the specific application of the processing circuit 2202 and the overall design constraints. The bus 2220 links together various circuits including one or more processors and/or hardware modules, represented by the processor 2216, the modules or circuits 2204, 2206, 2208, and 2210, line interface circuits 2212 configurable to communicate over connectors or wires 2214 and the computer-readable storage medium 2218. The bus 2220 may also link various other circuits such as timing sources, peripherals, voltage regulators, and power management circuits, which are well known in the art, and therefore, will not be described any further.

The processor 2216 is responsible for general processing, including the execution of software stored on the computer-readable storage medium 2218. The software, when executed by the processor 2216, causes the processing circuit 2202, to perform the various functions described supra for any particular apparatus. The computer-readable storage medium 2218 may also be used for storing data that is manipulated by the processor 2216 when executing software, including data decoded from symbols transmitted over the connectors or wires 2214. The processing circuit 2202 further includes at least one of the modules 2204, 2206, 2208, and 2210. The modules 2204, 2206, 2208, and 2210 may be software modules running in the processor 2216, resident/stored in the computer-readable storage medium 2218, one or more hardware modules coupled to the processor 2216, or some combination thereof. The modules 2204, 2206, 2208, and/or 2210 may include microcontroller instructions, state machine configuration parameters, or some combination thereof.

In one configuration, the apparatus 2200 includes modules and/or circuits 2204 for detecting pulses occurring in one or more signals received from the connectors or wires 2214 of a multi-wire interface, modules and/or circuits 2206 for providing pulses on a receive clock signal in response to detection of pulses in the one or more signals received from the connectors or wires 2214 of the multi-wire interface, modules and/or circuits 2208 for capturing a value representative of the presence or absence of a pulse in each wire 2214 of the multi-wire interface, and one or more delay circuits.

In one example, the apparatus 2200 includes a clock recovery circuit having a plurality of input latches configured to assume a first state when a first pulse is received in one or more of a plurality of input signals, combinational logic configured to provide a second pulse response to the first pulse, a delay circuit configured to produce a third pulse on a receive clock that is delayed with respect to the second pulse, and a plurality of output flip-flops configured to capture the first state when triggered by the third pulse, where the first state identifies which of the plurality of input signals received input pulses. In some instances, a one-shot circuit is configured to fix a duration of the second pulse.

The first state may be output as a digit of a multi-digit number. The plurality of input signals may be received from a multi-wire interface that includes N wires. In one example, the multi-digit number may be expressed as a base $(2^N-M)$, where M may be selected for processing efficiency reasons and/or based on the presence or absence of embedded clock information and/or other information in the multi-digit number. In one example, the plurality of input signals is received from a two-wire interface, and the multi-digit number may be expressed as a ternary number. In another example, the plurality of input signals is received from a three-wire interface, and the multi-digit number is expressed as a septenary number.

The plurality of input signals may be received from capacitively-coupled or inductively-coupled multi-wire interfaces. In some instances, the plurality of input signals is received from an optical interface.

Figure 23:
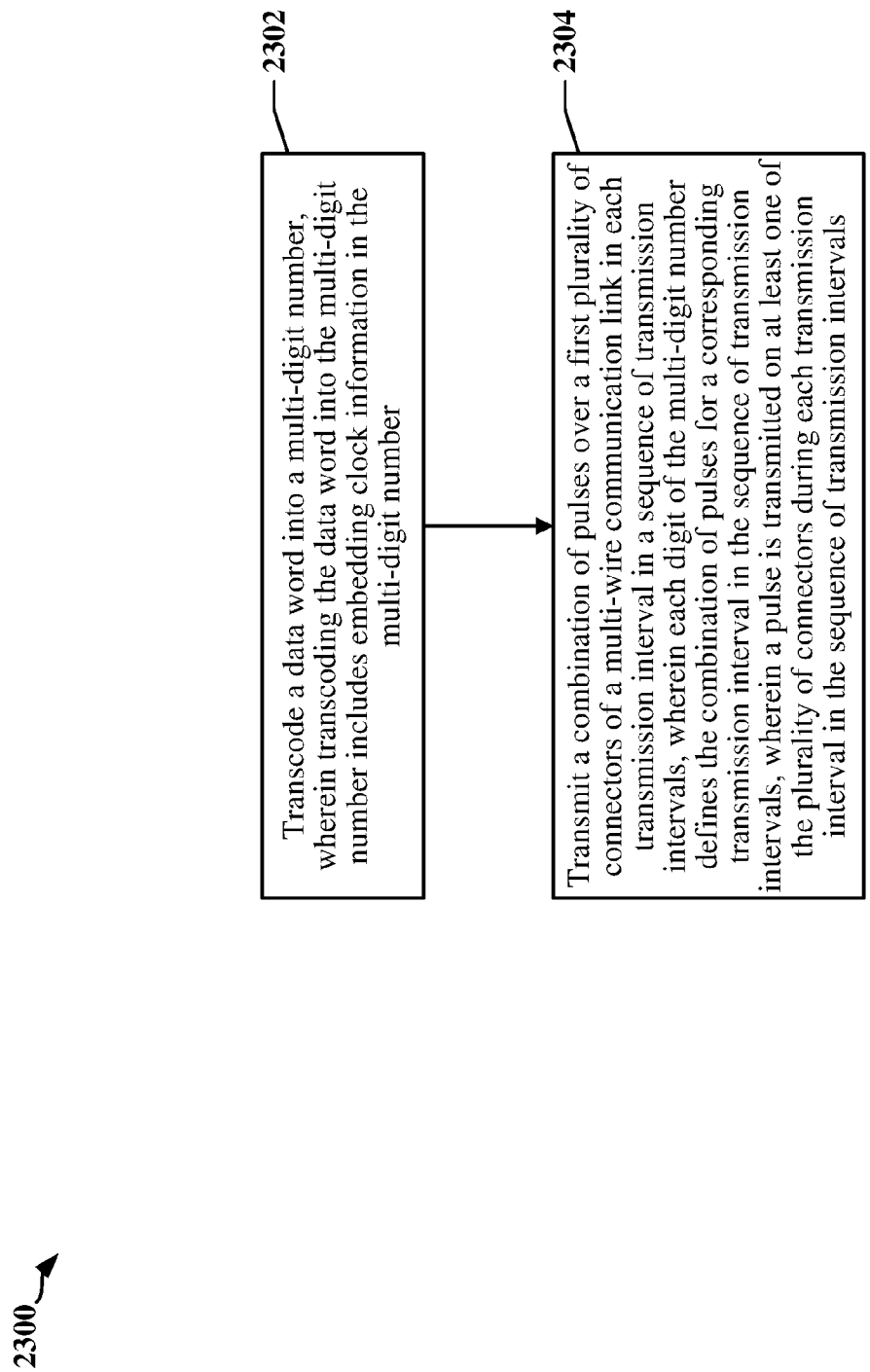
FIG. 23 is a flow chart of a method for transmitting signals on a multi-wire communication interface according to certain aspects disclosed herein.

FIG. 23 is a flow chart 2300 of a method for communicating on a multi-wire communication interface. Data may be encoded in combinations or patterns of pulses transmitted over the N wires of the N-wire interface.

At block 2302, a data word may be transcoded into a multi-digit number. Clock information may be embedded in the multi-digit number.

At block 2304, a combination of pulses may be transmitted over a first plurality of connectors of a multi-wire communication link for each transmission interval in a sequence of transmission intervals. Each digit of the multi-digit number may define the combination of pulses for a corresponding transmission interval in the sequence of transmission intervals. A pulse may be transmitted on at least one of the plurality of connectors during each transmission interval in the sequence of transmission intervals.

In some instances, the combinations of pulses provided to the first plurality of connectors through a capacitive, inductive, or optical coupling.

The first plurality of connectors includes N connectors and the multi-digit number is expressed as a base $(2^N-M)$, where M may be selected for processing efficiency reasons and/or based on the presence or absence of embedded clock information and/or other information in the multi-digit number. In one example, the first plurality of connectors may include two connectors and the multi-digit number is expressed as a ternary number. In another example, the first plurality of connectors includes three connectors and the multi-digit number is expressed as a septenary number.

In some examples, first information may be encoded in non-return-to-zero, pulse-encoded signals that is transmitted on the first plurality of connectors of the multi-wire interface. For example, the first information may be encoded in the presence or absence of a pulse on each of the first plurality of connectors during a transmission interval. Second information may be encoded in one or more non-return-to-zero signals. The one or more non-return-to-zero signals may be transmitted over a second plurality of connectors of the multi-wire interface. Information may be transmitted in signaling states of the second plurality of connectors. In one example, one or more wires may carry a signal that has two or more voltage or current states, and the second information may be encoded in the combination of signaling states of the second plurality of connectors during a transmission interval, or transitions in signaling states of the second plurality of connectors between successive transmission intervals.

Figure 24:
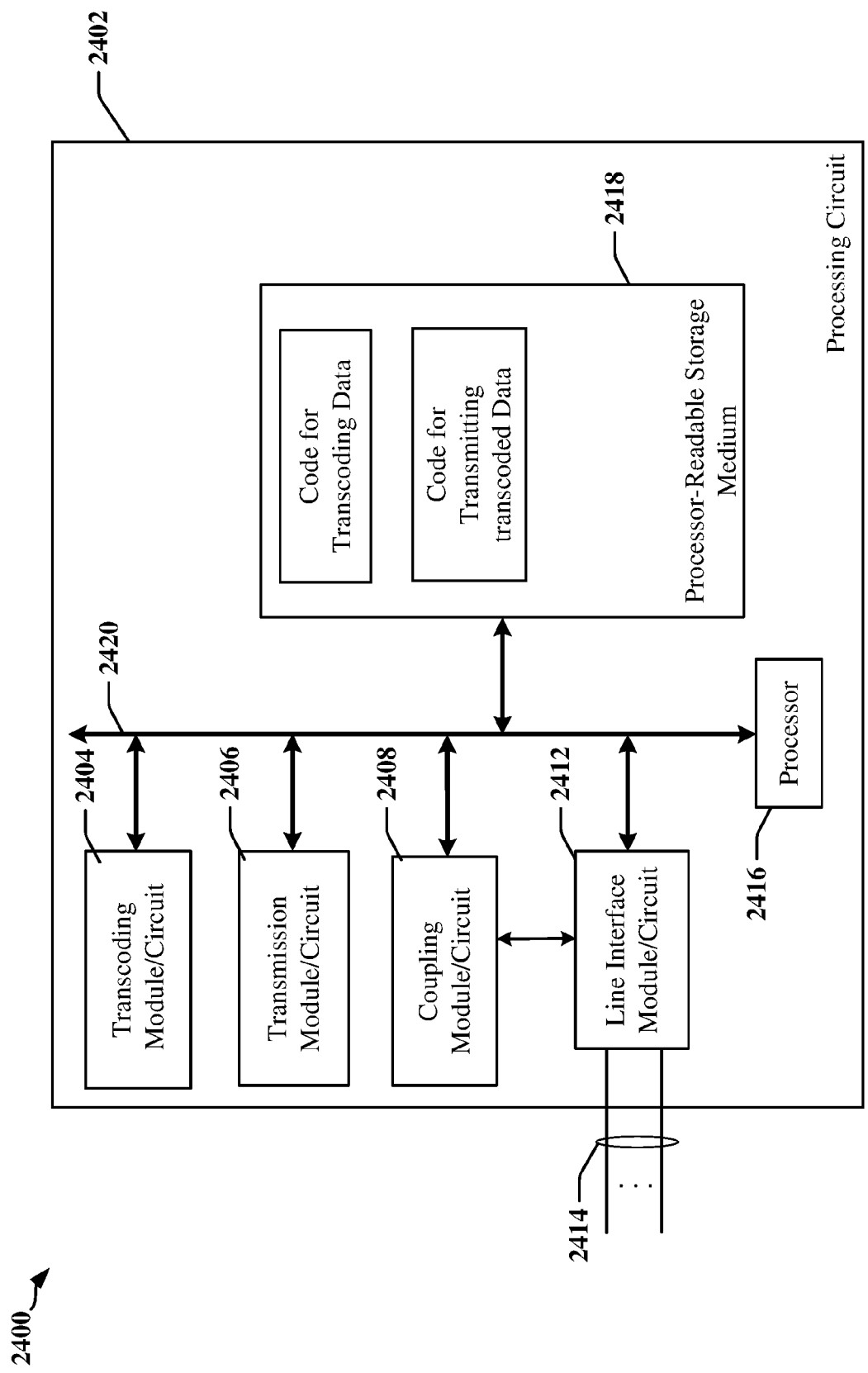
FIG. 24 is a diagram illustrating an example of a hardware implementation for a transmitting apparatus employing a processing circuit adapted according to certain aspects disclosed herein.

FIG. 24 is a diagram illustrating a simplified example of a hardware implementation for an apparatus 2400 employing a processing circuit 2402. The processing circuit typically has a processor 2416 that may include one or more of a microprocessor, microcontroller, digital signal processor, a sequencer and a state machine. The processing circuit 2402 may be implemented with a bus architecture, represented generally by the bus 2420. The bus 2420 may include any number of interconnecting buses and bridges depending on the specific application of the processing circuit 2402 and the overall design constraints. The bus 2420 links together various circuits including one or more processors and/or hardware modules, represented by the processor 2416, the modules or circuits 2404, 2406, 2408, and 2410, line interface circuits 2412 configurable to communicate over connectors or wires 2414 and the computer-readable storage medium 2418. The bus 2420 may also link various other circuits such as timing sources, peripherals, voltage regulators, and power management circuits, which are well known in the art, and therefore, will not be described any further.

The processor 2416 is responsible for general processing, including the execution of software stored on the computer-readable storage medium 2418. The software, when executed by the processor 2416, causes the processing circuit 2402 to perform the various functions described supra for any particular apparatus. The computer-readable storage medium 2418 may also be used for storing data that is manipulated by the processor 2416 when executing software, including data decoded from symbols transmitted over the connectors or wires 2414. The processing circuit 2402 further includes at least one of the modules 2404, 2406, and 2408. The modules 2404, 2406, 2408, and 2410 may be software modules running in the processor 2416, resident/stored in the computer-readable storage medium 2418, one or more hardware modules coupled to the processor 2416, or some combination thereof. The modules 2404, 2406, and/or 2408 may include microcontroller instructions, state machine configuration parameters, or some combination thereof.

In one configuration, the apparatus 2400 includes modules and/or circuits 2404 for transcoding a data word into a multi-digit number, modules and/or circuits 2406 for transmitting a pattern of pulses derived from the multi-digit number in one or more signals on the connectors or wires 2414 of a multi-wire communication link, and modules and/or circuits 2408 for coupling the apparatus to the connectors or wires 2414 of the multi-wire communication link.

In one example, the apparatus 2400 includes a transcoder that transcodes data words into multi-digit numbers that have clock information embedded therein and, circuitry configured to provide a combination of pulses for transmission over a plurality of connectors during one transmission interval in a sequence of transmission intervals. The combination of pulses in each transmission interval may be defined by a digit of the multi-digit number. A pulse is transmitted on at least one of the plurality of connectors during each transmission interval in the sequence of transmission intervals.

Where the plurality of connectors includes N connectors, the multi-digit number may be expressed as a base $(2^N-1)$ number. In one example, the plurality of connectors includes two connectors and the multi-digit, number is expressed as a ternary number. In another example, the plurality of connectors includes three connectors and the multi-digit number is expressed as a septenary number.

The modules and/or circuits 2408 for coupling the apparatus to the connectors or wires 2414 of the multi-wire communication link may include a transmitter configured to capacitively couple the transmitter to the plurality of connectors. The modules and/or circuits 2408 for coupling the apparatus to the connectors or wires 2414 of the multi-wire communication link, may include a transmitter configured to inductively couple the transmitter to the plurality of connectors. The modules and/or circuits 2408 for coupling the apparatus to the connectors or wires 2414 of the multi-wire communication link may include a transmitter configured to optically couple the transmitter to the plurality of connectors.

It is understood that the specific order or hierarchy of steps in the processes disclosed is an illustration of exemplar/approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent, with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for decoding data at a receiving device coupled to a multi-wire interface, comprising:
    at the receiving device, detecting pulses on one or more wires of the multi-wire interface;
    in each of a plurality of transmission intervals:
        generating an edge in a receive clock responsive to detecting a pulse on one or more wires of the multi-wire interface; and
        providing a digit of a multi-digit number after the edge in the receive clock is generated in each of the plurality of transmission intervals, wherein each bit of the digit identifies whether a pulse was transmitted on one wire of the multi-wire interface during a corresponding transmission interval;
    combining digits generated in the plurality of transmission intervals to obtain the multi-digit number; and
    transcoding the multi-digit number to obtain received data,
    wherein a pulse is transmitted on at least one wire of the multi-wire interface during each of the plurality of transmission intervals.

2. The method of claim 1, wherein a data word is encoded in the multi-digit number.

3. The method of claim 1, wherein the multi-wire interface comprises N wires and the multi-digit number is expressed as a base ($2^N-1$) number.

4. The method of claim 1, wherein the multi-wire interface is a two-wire interface and the multi-digit number is expressed as a ternary number, or the multi-wire interface is a three-wire interface and the multi-digit number is expressed as a septenary number.

5. The method of claim 1, further comprising:
    decoding first information from return-to-zero pulse-encoded signals received from the multi-wire interface; and
    decoding second information from one or more non-return-to-zero signals received from the multi-wire interface.

6. The method of claim 1, wherein capacitively-coupled signals are received from the multi-wire interface.

7. The method of claim 1, wherein inductively-coupled signals are received from the multi-wire interface.

8. The method of claim 1, wherein optically-coupled signals are received from the multi-wire interface.

9. The method of claim 1, wherein generating the edge in the receive clock comprises:
    combining pulses received on the one or more wires into a combination signal; and
    delaying the combination signal to provide the receive clock.

10. The method of claim 1, wherein generating the edge in the receive clock comprises:
    combining pulses received on the one or more wires into a combination signal;
    providing the combination signal to one-shot logic that is configured to produce a fixed-duration pulse responsive to an edge in the combination signal; and
    delaying the fixed-duration pulse to provide a pulse in the receive clock.

* * * * *